United States Patent [19]
Takahashi et al.

[11] Patent Number: 5,592,101
[45] Date of Patent: Jan. 7, 1997

[54] ELECTRO-OPTIC APPARATUS FOR MEASURING AN ELECTRIC FIELD OF A SAMPLE

[75] Inventors: Hironori Takahashi; Shinichiro Aoshima; Isuke Hirano, all of Hamamatsu, Japan

[73] Assignee: Hamamatsu Photonics K.K., Hamamatsu, Japan

[21] Appl. No.: 94,974

[22] Filed: Jul. 22, 1993

[30] Foreign Application Priority Data

Jul. 24, 1992 [JP] Japan .................................... 4-198791

[51] Int. Cl.$^6$ .................................................. G01R 29/12
[52] U.S. Cl. ........................... 324/753; 324/96; 324/750
[58] Field of Search ................................. 324/96, 117 R, 324/751, 752, 753, 458, 118; 250/306, 307, 310, 311; 359/240, 248; 356/400, 401

[56] References Cited

U.S. PATENT DOCUMENTS

| | | | |
|---|---|---|---|
| 4,446,425 | 5/1984 | Valdmanis et al. | 324/96 |
| 4,618,819 | 10/1986 | Mourou et al. | 324/96 |
| 4,908,571 | 3/1990 | Stoehr | 324/758 |
| 4,928,058 | 5/1990 | Williamson | 324/96 |
| 4,996,475 | 2/1991 | Takahashi et al. | 324/96 |
| 5,272,434 | 12/1993 | Meyrueix et al. | 324/96 |
| 5,274,325 | 12/1993 | Shinagawa et al. | 324/96 |
| 5,289,114 | 2/1994 | Nakamura et al. | 324/96 |
| 5,406,213 | 4/1995 | Henley | 324/96 |
| 5,412,330 | 5/1995 | Ravel et al. | 324/96 |

FOREIGN PATENT DOCUMENTS

| | | |
|---|---|---|
| 2238376 | 9/1990 | Japan . |
| 318780 | 1/1991 | Japan . |
| 5107273 | 4/1993 | Japan . |

OTHER PUBLICATIONS

Shinagawa et al., "A Laser-Diode-Based Picosecond Electrooptic Prober For High-Speed LSI's", IEEE Transactions On Instrumentation And Measurement, vol. 4, No. 3, Jun. 1992, pp. 375–380.

Nagatsuma et al., "Subpicosecond Sampling Using A Noncotact Electro–Optic Probe", Journal Of Applied Physics, vol. 66, No. 9, Nov. 1, 1989, pp. 4001–4009.

(List continued on next page.)

*Primary Examiner*—Vinh P. Nguyen
*Attorney, Agent, or Firm*—Cushman Darby & Cushman IP Group of Pillsbury Madison & Sutro LLP

[57] ABSTRACT

An electric field measuring apparatus for causing an optical probe head having an electro-optic member with an electro-optic material to oppose a sample such as a semiconductor integrated circuit device and for optically measuring a voltage of an opposite portion of the sample. The electro-optic material consists of an LiTaO$_3$ electro-optic crystal or the like, the polarization characteristics of which change depending on the electric-field strength of the sample. The electro-optic member is supported on a guide mechanism to be reciprocally movable within a predetermined stroke range in a direction of the sample. The guide mechanism is reciprocated in the direction of the sample to control the distance between the electro-optic material and the sample. In measurement, light is incident on the electro-optic material whose polarization characteristics change depending on the electric-field strength, and the light intensity of a predetermined polarized component of the light reflected by the electro-optic material is detected, thereby measuring the electric-field strength and voltage of the sample. When if the electro-optic member is brought into contact with the sample, the sample is not damaged due to the stroke set in the guide mechanism. The simple structure of the guide mechanism realizes improvement of operability. The electro-optic member can therefore safety approach the sample to increase the measurement sensitivity.

29 Claims, 15 Drawing Sheets

OTHER PUBLICATIONS

Frankel et al., "Experimental Characterization Of External Electroopic Probes", IEEE Microwave And Guided Wave Letters, vol. 1, No. 3, Mar. 1991, pp. 60–62.

Kolner et al, "Electrooptic Sampling in GaAs Integrated Circuits", IEEE Journal Of Quantum Electronics, vol. QE–22, No. 1, Jan. 1986.

Valdmanis et al, "Subpicosecond Electroopic Sampling: Principles and Applications", IEEE Journal Of Quantum Electronics, vol. QE–22, No. 1, Jan. 1986.

Aishima et al, "Non–Contact Picosecond Electro–optic Sampling With a Semiconductor Laser", Dengakuron–C, vol. 111, No. 4, 1991 (no month available).

Fig. 23
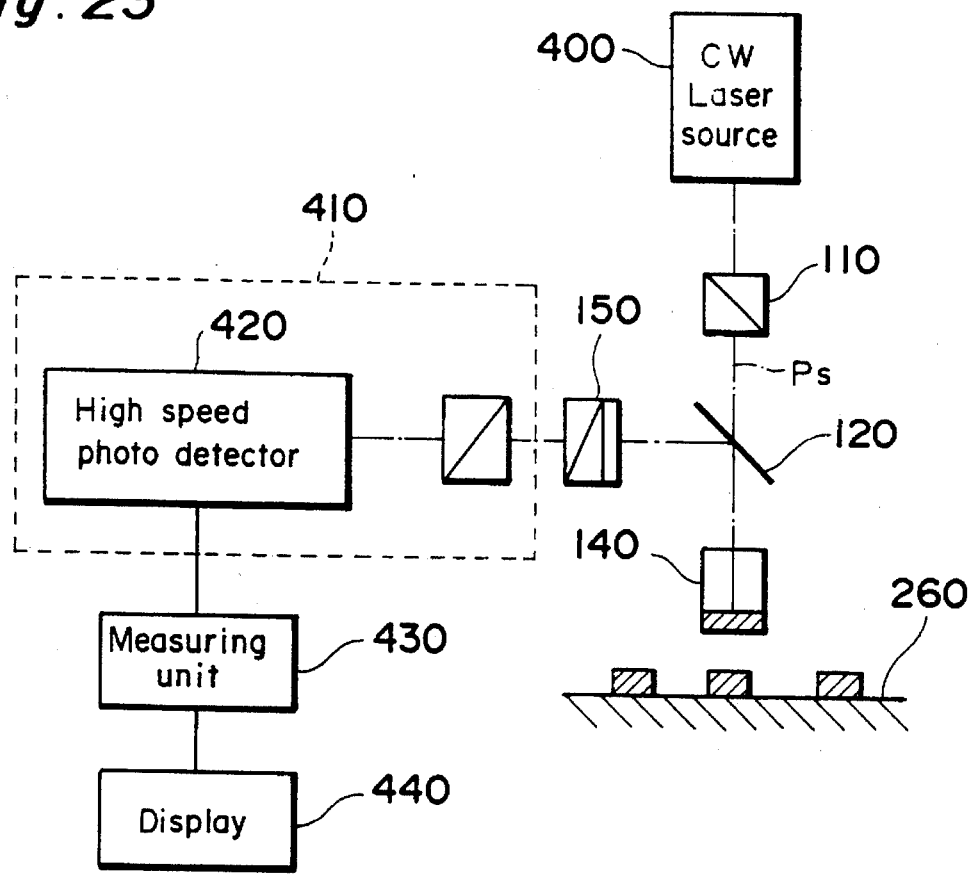
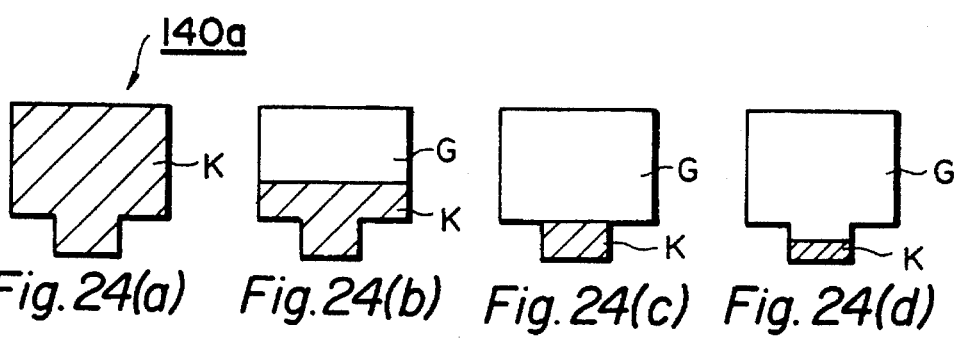
Fig. 24(a)   Fig. 24(b)   Fig. 24(c)   Fig. 24(d)
Fig. 25(a)   Fig. 25(b)   Fig. 25(c)   Fig. 25(d)

ELECTRO-OPTIC APPARATUS FOR MEASURING AN ELECTRIC FIELD OF A SAMPLE

BACKGROUND OF THE INVENTION

The present invention relates to an electric field measuring apparatus for optically measuring a voltage at a portion of a sample such as a semiconductor integrated circuit device which opposes an optical probe head having an electro-optic material and, more particularly, to an electric field measuring apparatus which realizes an increase in measuring sensitivity and an improvement of operability with a simple mechanism.

In a conventional electric field measuring apparatus, an optical probe head having an electro-optic material such as an $LiTaO_3$ crystal is used. After the position of the optical probe head is adjusted such that a sample comes very close to the electro-optic material, a specific polarized beam such as a linearly, circularly, or elliptically polarized light component is radiated on an end portion of the electro-optic material which is opposite to the side of the sample. A polarized beam reflected by the opposing end face (i.e., an end face opposite to the sample) of the electro-optic material is converted into a change in light intensity by an analyzer. A photodetector measures this change in light intensity.

The electro-optic material has electro-optic characteristics for changing polarization characteristics in accordance with the intensity of an external electric field. For this reason, the polarized beam reflected by the opposing end face of the electro-optic material is polarized in accordance with the intensity of the electric field from the sample and is then incident on the analyzer. The output level of the photodetector is equivalent to the voltage level of the sample.

The electric field measuring apparatus thus has an excellent function capable of indirectly measuring the voltage of the sample without being brought into direct contact with the sample. For example, while a semiconductor integrated circuit device is actually being operated, voltages and the like of the respective portions of internal circuit wiring can be measured without adversely affecting the operation of the semiconductor integrated circuit device. The voltage distribution of the semiconductor integrated circuit device can be examined to find an abnormal circuit portion or the like.

Conventional electric field measuring apparatuses of this type are disclosed in Japanese Patent Laid-Open No. 3-18780; U.S. Pat. Nos. 4,618,819, 4,446,425, and 4,996,475; BRIAN H. KOLNER et al., "Electro-optic Sampling in GaAs Integrated circuits", IEEE JOURNAL OF QUANTUM ELECTRONICS, VOL. QE-22, NO. 1, JANUARY 1986, A. VALDMANIS et al., "Subpicosecond Electro-optic Sampling: Principles and Applications", IEEE JOURNAL OF QUANTUM ELECTRONICS, VOL. QE-22, NO. 1, JANUARY 1986 and T. NAGATSUMA et al., "Subpicosecond Sampling using noncontact electro-optic probe", J. Appi. Phys. 66(9), 1 Nov. 1989.

To increase the detection sensitivity of an electric field measuring apparatus, the distance between a sample and the opposing end face of the electro-optic material in the optical probe head must be sufficiently small. When the distance is reduced, the electro-optic material is more easily influenced by an electric field from the sample. Therefore, a lower electric field intensity can be detected, and the detection sensitivity can be increased. A means for decreasing this distance has been conventionally implemented while preventing damage caused by a force acting upon contact between the electro-optic material and the sample.

In a means disclosed in Japanese Patent Laid-Open No. 3-18780, a spring having a predetermined length is arranged at one end of an optical probe. When an electro-optic material is brought into contact with a sample, the spring is brought into elastic contact with one end of the sample, thereby preventing mutual damage caused by contact between the electro-optic material and the sample beforehand. However, when a spring having a large reaction is used, a sample having a smaller strength than the reaction is damaged. A problem as to selection of a spring to be used is left unsolved. This means is not a versatile means.

In T. NAGATSUMA et al., "Subpicosecond Sampling using noncontact electro-optic probe", J. Appi. Phys. 66(9), 1 Nov. 1989, there is provided a noncontact type electric field measuring apparatus in which the distance between an electro-optic material and a sample is measured with high precision, and the electro-optic material is always kept separated from the sample.

An arrangement of this noncontact electric field measuring apparatus will be described below with reference to FIG. 30.

A half mirror 2, a multi-focus (double-focus) lens 4 having two focal points, and an electro-optic material 10 are arranged on the same optical axis. This apparatus also includes a sample stage 22 for supporting a sample 18 to oppose the electro-optic material 10.

The electro-optic material 10 is fixed to the open distal end of an optical probe head 8 fixed to a support 6. When the support 6 is vertically displaced by a piezoelectric driving unit 14, the distance between the multi-focus lens 4 and the electro-optic material 10 changes.

A light beam L containing components having two wavelengths $\lambda_1$ and $\lambda_2$ is incident on the multi-focus (double-focus) lens 4 through the half mirror 2. The light beam L is focused at different focal positions, reflected at these focal positions, and returns to the half mirror 2 because the multi-focus lens 4 has focal lengths $f_1$ and $f_2$ respectively for the wavelengths $\lambda_1$ and $\lambda_2$. The reflected beam is picked up by a TV camera 24, visualized on a monitor 26, and analyzed by a video signal analyzer 28.

The video signal analyzer 28 analyzes data of the reflected light beam to determine whether the incident light beam L is focused on the electro-optic material 10 and the sample 18. When the light component having the wavelength $\lambda_2$ is determined not to be focused at the focal point corresponding to the focal length $f_2$ (i.e., a near or far-focus state is set), the video signal analyzer 28 commands a controller 12 to drive the piezoelectric driving unit 14. The support 6 is vertically displaced, as indicated by a double-headed arrow, to perform automatic adjustment so as to obtain an in-focus state.

When the light component having the wavelength $\lambda_1$ is determined not to be focused at a focal point corresponding to the focal length $f_1$, the video signal analyzer 28 commands a stage controller 20 to vertically displace the sample stage 22, as indicated by a double-headed arrow. Automatic adjustment is thus performed to focus the light component having the wavelength $\lambda_1$ on the surface of the electro-optic material 10.

As described above, when the light components having the wavelengths $\lambda_1$ and $\lambda_2$ are set in the in-focus state, a measurement distance $h_0$ between the electro-optic material 10 and the sample 18 becomes a difference ($f_1-f_2$) between the focal lengths. For this reason, this difference ($f_1-f_2$)

between the focal lengths is defined as a reference distance in advance. To actually measure the electric-field strength of the sample 18, an optical displacement sensor 16 sequentially measures the positions of the support 6 as displacement amounts from the reference distance ($f_1-f_2$), thereby detecting the actual measurement distance $h_0$. In addition, the distance between the electro-optic material 10 and the sample 18 can be finely adjusted so as not to contact each other because the actual measurement distance $h_0$ can be measured.

Another non-contact electric field measuring apparatus for measuring and controlling the measurement distance $h_0$ is also disclosed in a reference (Singaku Giho Vol. 91, No. 234, p. 33). This apparatus measures the distance between a sample and an optical probe using a balance mechanism. In addition, the displacement of the optical probe is also measured using an optical displacement sensor.

SUMMARY OF THE INVENTION

In such a conventional non-contact electric field measuring apparatus, the distance between the electro-optic material and the sample is measured with high precision and is so controlled as not to cause contact between the electro-optic material and the sample. The sample is not damaged, a very small distance can be set, and the electric field measurement sensitivity can be increased.

Although the above apparatus employs an excellent principle of measurement, vertical driving of the piezoelectric driving unit 14 and the sample stage 22 must be controlled with high mechanical precision. High-precision constituent components are required, which makes it difficult to arrange an actual apparatus. The electrical control system is also complicated to make it difficult to obtain a compact apparatus.

The optical displacement sensor 16 does not directly measure the distance between the optical probe head 8 and the sample 18, but measures the distance as an indirect displacement amount on the basis of the predetermined reference distance ($f_1-f_2$). For this reason, an extra operation for setting the reference distance ($f_1-f_2$) in advance is required, and operations required for an operator are cumbersome.

The present invention has been made in consideration of the conventional problems described above, and has as its object to provide an electric field measuring apparatus employing a simpler mechanism and having improved measurement precision.

It is another object of the present invention to provide an electric field measuring apparatus employing a simpler mechanism to improve operability.

It is still another object of the present invention to use a simple mechanism to realize a protective mechanism free from damage and destruction of an optical probe head and a sample even if the optical probe head is brought into contact with the sample.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 23 is a block diagram showing an arrangement according to the third embodiment of the present invention;

FIGS. 24(*a*) to 24(*d*) are views for explaining the sectional shape of a modification of the electro-optic member;

FIGS. 25(*a*) to 25(*d*) are views for explaining the sectional shape of another modification of the electro-optic member;

DETAILED DESCRIPTION OF THE PREFERRED EMBODIMENTS

The first embodiment of the present invention will be described with reference to the accompanying drawings. The first embodiment exemplifies an electric field measuring apparatus for detecting an electric field generated by a sample such as a semiconductor integrated circuit device to measure, e.g., the voltage distribution or the like of circuit wiring. The present invention is not limited to the measurement for semiconductor integrated circuit devices.

Figure 1:
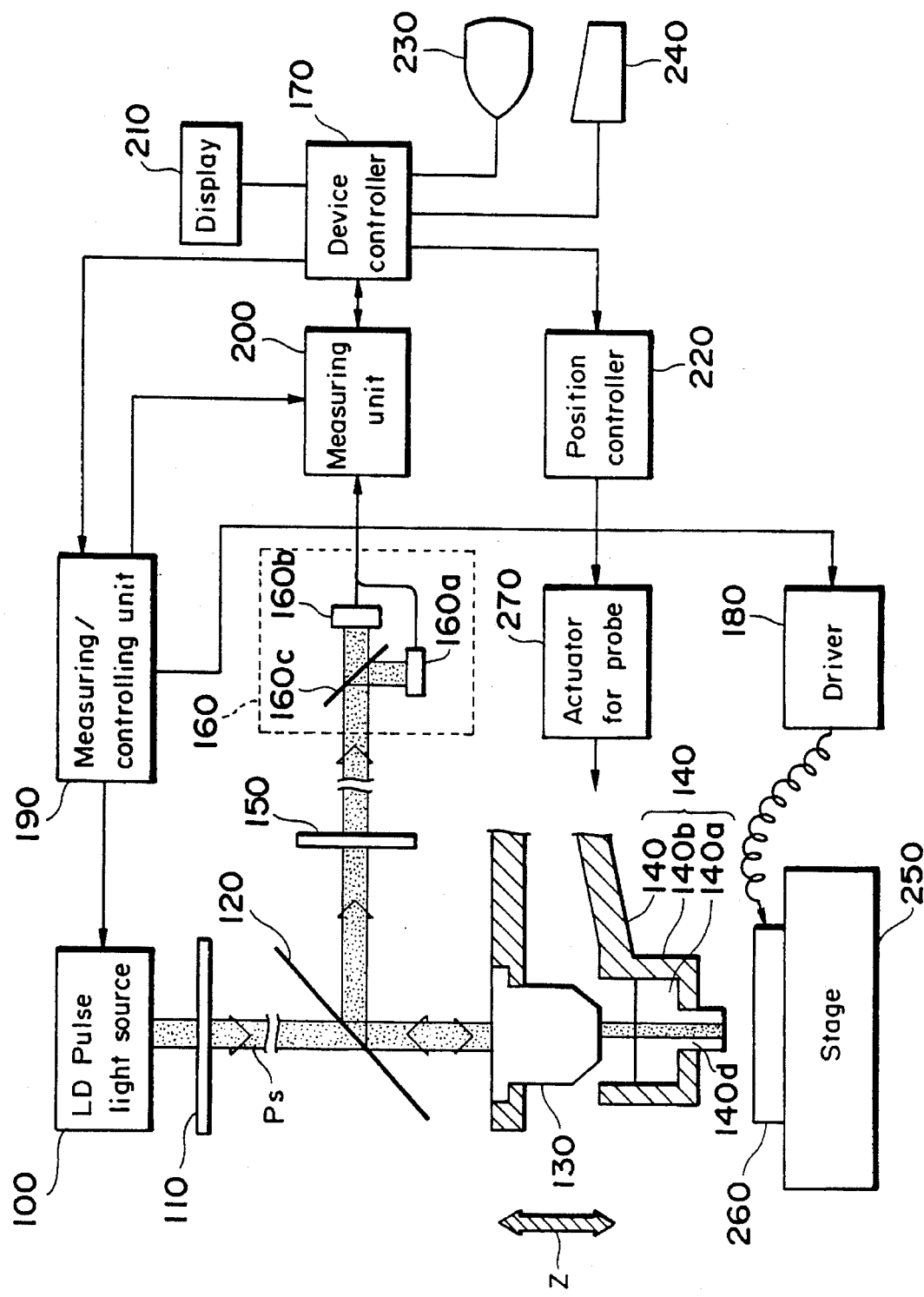
FIG. 1 is a block diagram showing an arrangement of an electric field measuring apparatus according to the first embodiment of the present invention.

FIG. 1 shows the arrangement of the main part of this embodiment. This electric field measuring apparatus comprises an optical mechanism and a measurement control mechanism. Actuator 270 serves as driving means.

First of all, the arrangement of the optical mechanism will be described. The optical mechanism comprises an LD pulse light source 100 using a laser diode, a polarizer 110, a half mirror 120, an objective lens 130, an optical probe head 140 having an electro-optic crystal whose polarization changes in accordance with a electric-field strength, a Soleil-Babinet compensator 150, and a photodetector 160.

The optical probe head 140 may have any one of various structures shown in FIGS. 2 to 11.

Figure 2:
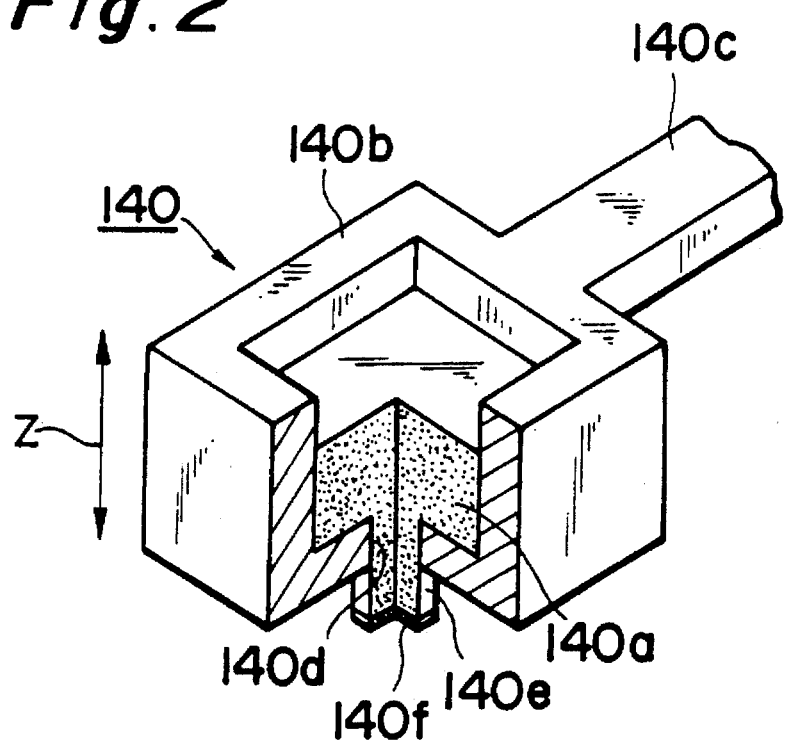
FIG. 2 is a partially cutaway perspective view showing the main part of an optical probe head.

An optical probe head 140 shown in FIG. 2 comprises a quadrangular cylinder 140b having a bottom and integrally formed at a distal end portion of a support 140c, and a rectangular electro-optic conversion member 140a slidably fitted in the cylinder 140b. Note that FIG. 2 is a partially cutaway perspective view of the optical probe head 140.

A small through hole 140d is formed at the central portion of the bottom of the cylinder 140b, and a small projection 140e formed integrally with the bottom end portion of the electro-optic conversion member 140a is slidably inserted in the small through hole 140d. A reflecting portion 140f having a small area and consisting of an insulating material is fixed on the bottom end of the projection 140e to reflect, inside the electro-optic conversion member 140a, light incident downward on the electro-optic conversion member 140a and propagating through the electro-optic conversion member 140a. That is, the reflecting surface (mirror surface) of the reflecting portion 140f is in tight contact with the bottom end of the small projection 140e and is realized by coating a dielectric multilayered film.

The volume of the electro-optic conversion member 140a is about 1 mm$^3$, and the storage volume of the cylinder 140b is designed in accordance with the volume of the electro-optic conversion member 140a. The electro-optic conversion member 140a and the storage portion of the cylinder 140b have complementary rectangular shapes, so that the member 140a is fitted in the cylinder 140b. Rotation and lateral movement of the electro-optic conversion member 140a within the cylinder 140b are inhibited. The electro-optic conversion member 140a can be slidably reciprocated in only a direction (i.e., a direction indicated by an arrow Z, which will be referred to as a vertical direction Z hereinafter) along which the small projection 140e is formed. That is, the cylinder 140b has a function serving as a guide means for moving the electro-optic conversion member 140a in only the vertical direction Z.

The base portion of the electro-optic conversion member 140a which is inserted in the storage portion of the cylinder 140b and the small projection 140e extending on the base portion are integrally formed of an electro-optic crystal. Alternatively, the base portion nay be formed to have a two-layered structure consisting of light-transmitting glass and an electro-optic crystal, and the small projection 140e consisting of an electro-optic crystal may be formed integrally with the bottom end of the electro-optical crystal of the base portion.

Figure 11:
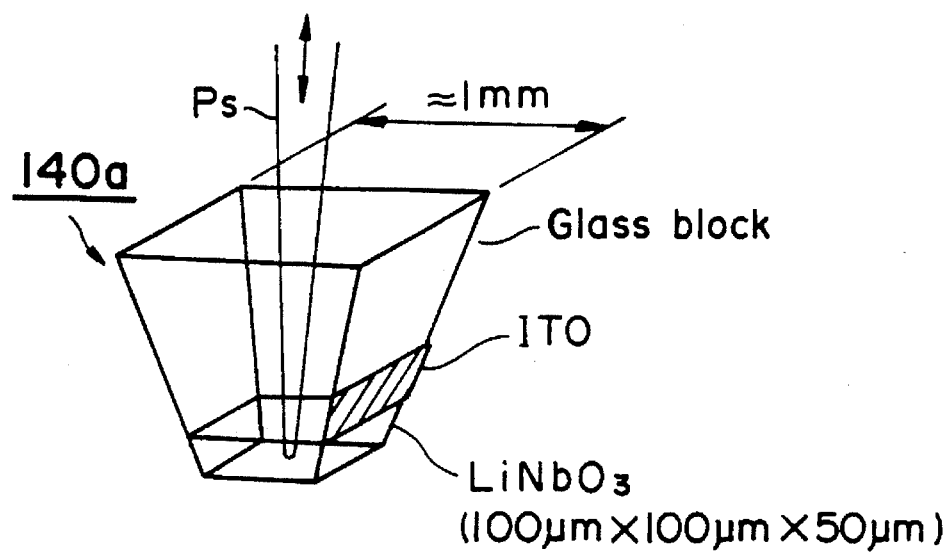
FIG. 11 is a perspective view showing the structure of a modification of the electro-optic member.

FIG. 11 shows a structure obtained by forming the base portion by the two-layered structure of light-transmitting glass and the electro-optic crystal and integrally projecting the small projection 140e of the electro-optic crystal on the bottom end of the electro-optic crystal of the base portion. That is, a rectangular electro-optic crystal (e.g., LiNbO$_3$) having a size of 10 μm×10 μm×10 μm to 100 μm×100 μm×50 μm is fixed on the bottom end of the light-transmitting glass block. An ITO transparent electrode is fixed on one end of the glass block.

Although not shown in FIG. 2, a contact switch (to be described later) is arranged between the inner contact surfaces of the electro-optic conversion element 140a and the cylinder 140b.

Figure 3:
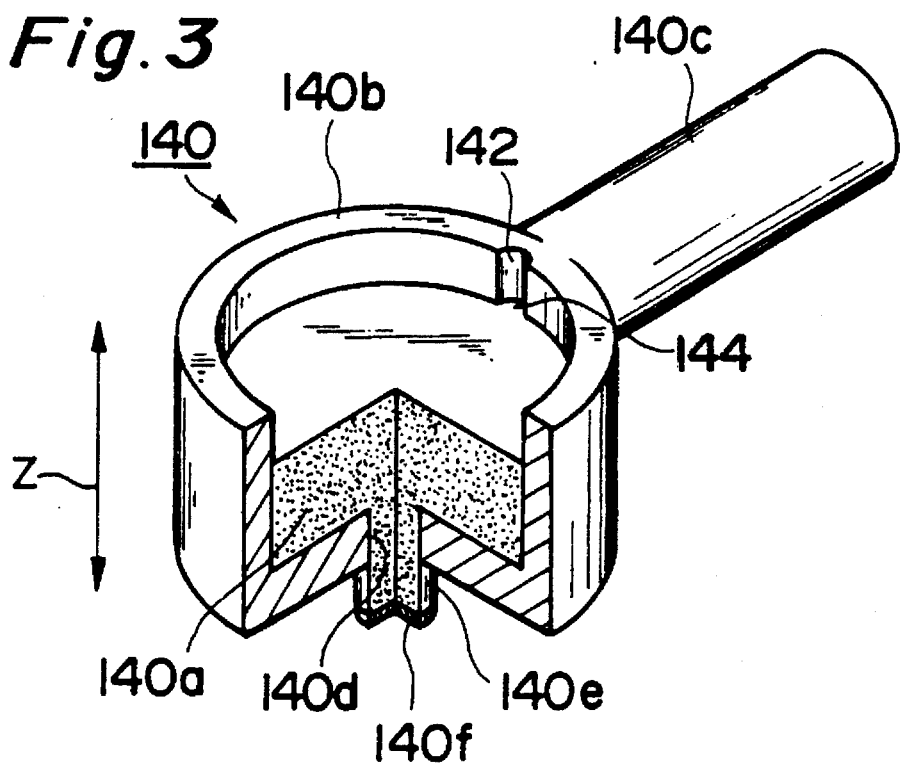
FIG. 3 is a partially cutaway perspective view showing the main part of another optical probe head.

An Optical probe head 140 shown in FIG. 3 has a circular cylinder 140b having a bottom and formed integrally with a distal end portion of a support 140c, and a columnar electro-optic conversion element 140a slidably fitted in the cylinder 140b. Note that FIG. 3 is R partially cutaway perspective view of the optical probe head 140.

A small through hole 140d is formed at the central portion of the bottom of the cylinder 140b, and a small projection 140e formed integrally with the bottom end portion of the electro-optic conversion member 140a is slidably inserted in the small through hole 140d. A reflecting portion 140f having a small area and consisting of an insulating material is fixed on the bottom end of the projection 140e to reflect, inside the electro-optic conversion member 140a, light incident downward on the electro-optic conversion member 140a and propagating through the electro-optic conversion member 140a. That is, the reflecting surface (mirror surface) of the reflecting portion 140f is in tight contact with the bottom end of the small projection 140e.

The volume of the electro-optic conversion member 140a is about 1 mm$^3$, and the storage volume of the cylinder 140b is designed in accordance with the volume of the electro-optic conversion member 140a.

At least one guide groove 142 is formed in the inner wall surface of the storage portion of the cylinder 140b, and at least one ridge 144 formed on the electro-optic conversion member 140a is locked in the corresponding guide groove, thereby preventing the electro-optic conversion member 140a from rotation and lateral movement. Note that FIG. 3 shows a case in which a pair of guide grooves 142 and a pair of ridges 144 are formed. The electro-optic conversion member 140a can be slidably reciprocated within the cylinder 140b in only the vertical direction Z. The cylinder 140b has a function serving as a guide means for moving the electro-optic conversion member 140a in only the vertical direction Z. In FIG. 3, the ridges 144 formed on the electro-optic conversion member 140a are locked in the corresponding guide grooves 142 formed on the inner wall surface of the storage portion of the cylinder 140b. However, a guide groove may be formed in the electro-optic conversion member 140a, and a ridge may be formed on the inner wall surface of the storage portion of the cylinder 140b, and this projection may be locked in the guide groove.

The base portion of the electro-optical conversion member 140a which is inserted in the storage portion of the cylinder 140b and the small projection 140e extending Dn the base portion are integrally formed of an electro-optic crystal. Alternatively, the base portion nay be formed to have a two-layered structure consisting of light-transmitting glass and an electro-optic crystal, and the small projection 140e consisting of an electro-optic crystal may be formed integrally with the bottom end of the electro-optical crystal of the base portion (FIG. 11).

Although not shown in FIG. 3, a contact switch (to be described later) is arranged between the inner contact surfaces of the electro-optic conversion element 140a and the cylinder 140b.

Figure 4:
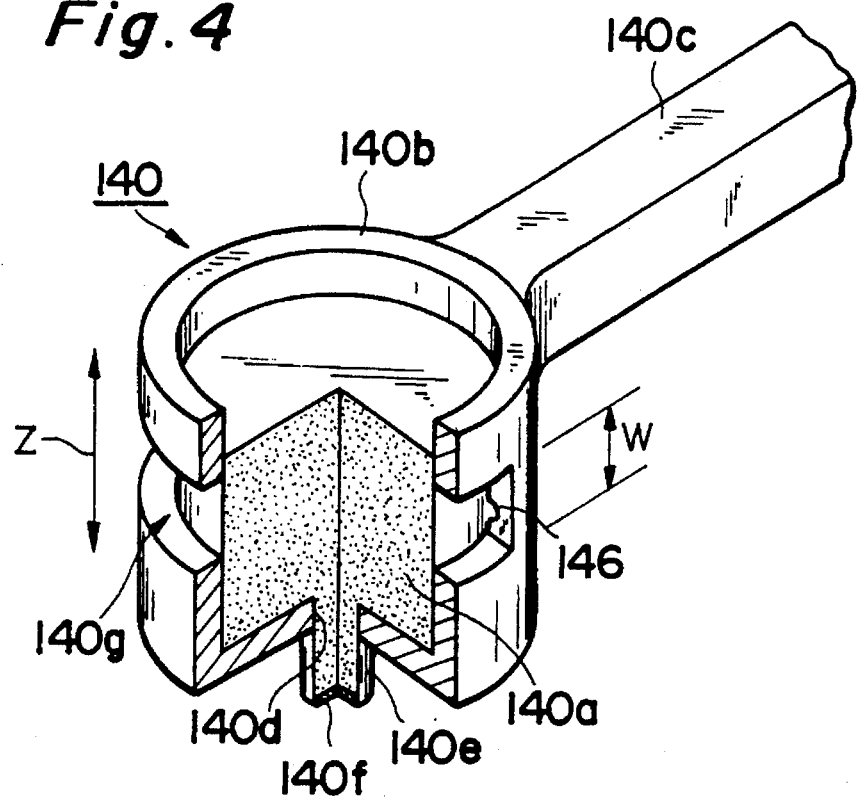
FIG. 4 is a partially cutaway perspective view showing the main part of still another optical probe head.
Figure 5:
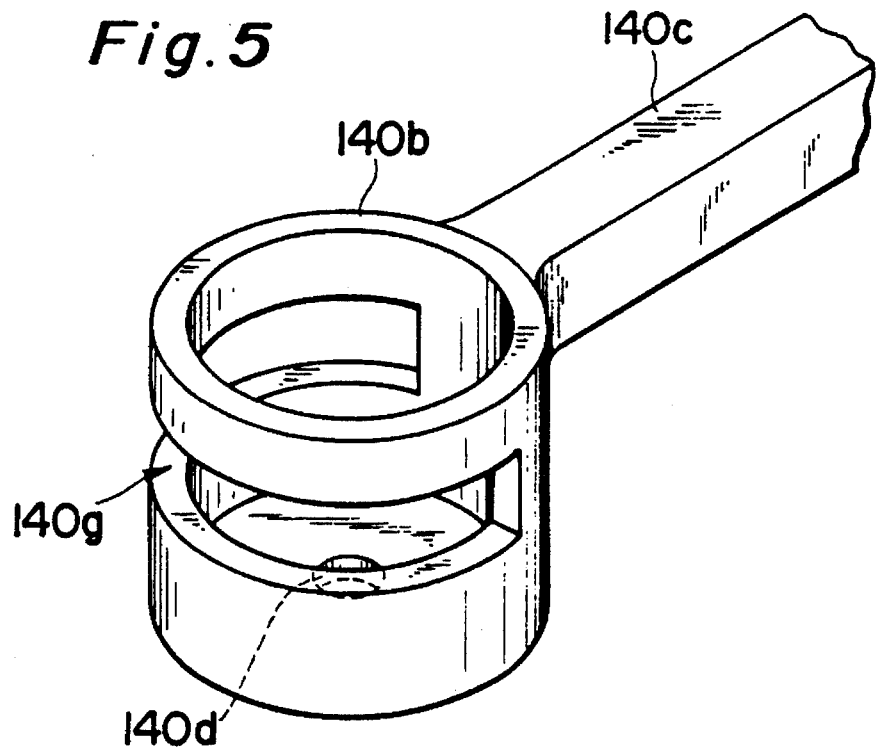
FIG. 5 is a perspective view showing a state in which in electro-optic member is removed from the optical probe head shown in FIG. 4.

An optical probe head 140 shown in FIGS. 4 and 5 comprises a circular cylinder 140b having a bottom and formed integrally with a distal end portion of a support 140c, and a columnar electro-optic conversion element 140a slidably fitted in the cylinder 140b. Note that FIG. 4 is a partially cutaway perspective view of the optical probe head 140, and FIG. 5 is a perspective view of the cylinder 140b and the support 140c in a state wherein the electro-optic conversion member 140a is removed from the optical probe head 140.

Referring to FIG. 5, an opening 140g is circumferentially formed along the circumferential surface of the cylinder 140b, and a small through hole 140d is formed in the central portion of the bottom end or the cylinder 140b.

As shown in FIG. 4, the electro-optic conversion member 140a is fitted in the storage portion of the cylinder 140b, and a small projection 140e formed integrally with the bottom end portion of the electro-optic conversion member 140a is slidably inserted in the small through hole 140d. A reflecting portion 140f having a small area and consisting of an insulating material is fixed on the bottom end of the projection 140e to reflect, inside the electro-optic conversion member 140a, light incident downward on the electro-optic conversion member 140a and propagating through the electro-optic conversion member 140a. That is, the reflecting surface (mirror surface) of the reflecting portion 140f is in tight contact with the bottom end of the small projection 140e.

The volume of the electro-optic conversion member 140a is about 1 mm$^3$, and the storage volume of the cylinder 140b is designed in accordance with the volume of the electro-optic conversion member 140a.

At least one small projection 146 which is engaged with the opening 140g is formed on the outer surface of the electro-optic conversion member 140a. This projection 146 abuts against one end of the opening 140g to inhibit rotation and lateral movement of the electro-optic conversion member 140a. The electro-optic conversion member 140a can be reciprocated within the range of an opening width W of the opening 140g in the vertical direction Z. Therefore, the cylinder 140b has a function serving as a means for guiding the electro-optic conversion member 140b in only the vertical direction Z.

The base portion of the electro-optical conversion member 140a which is inserted in the storage portion of the cylinder 140b and the small projection 140e extending on the base portion are integrally formed of an electro-optic crystal. Alternatively, the base portion may be formed to have a two-layered structure consisting of light-transmitting glass and an electro-optic crystal, and the small projection 140e consisting of an electro-optic crystal may be formed integrally with the bottom end of the electro-optical crystal of the base portion (FIG. 11).

Although not shown in FIGS. 4 and 5, a contact switch (to be described later) is arranged between the inner contact surfaces of the electro-optic conversion element 140a and the cylinder 140b.

Figure 6:
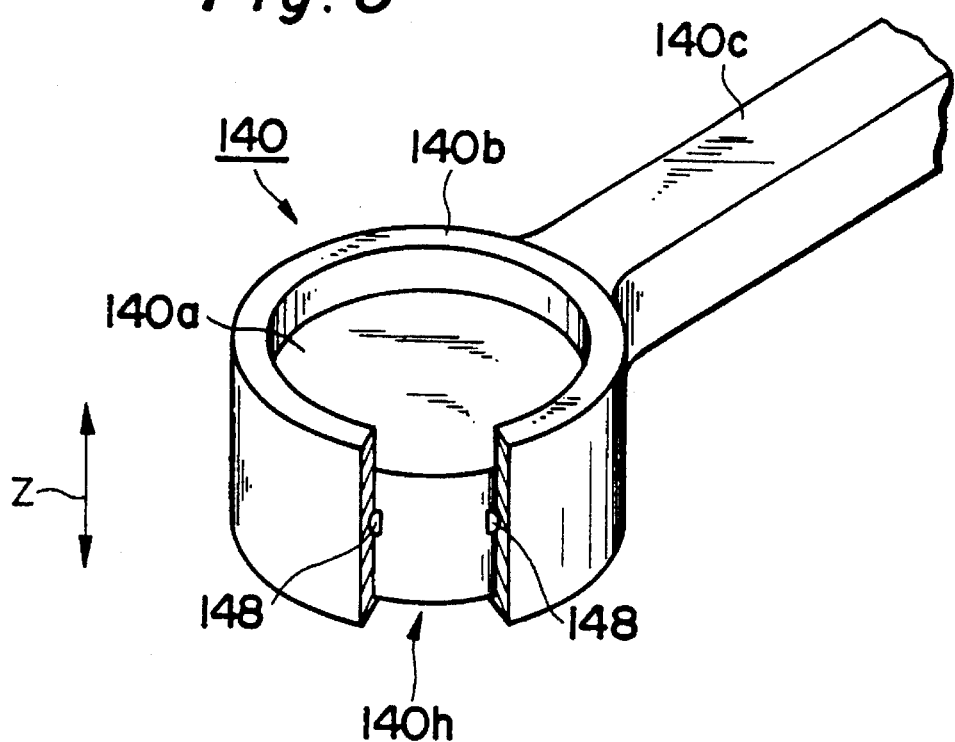
FIG. 6 is a partially cutaway perspective view showing the main part of still another optical probe head.
Figure 7:
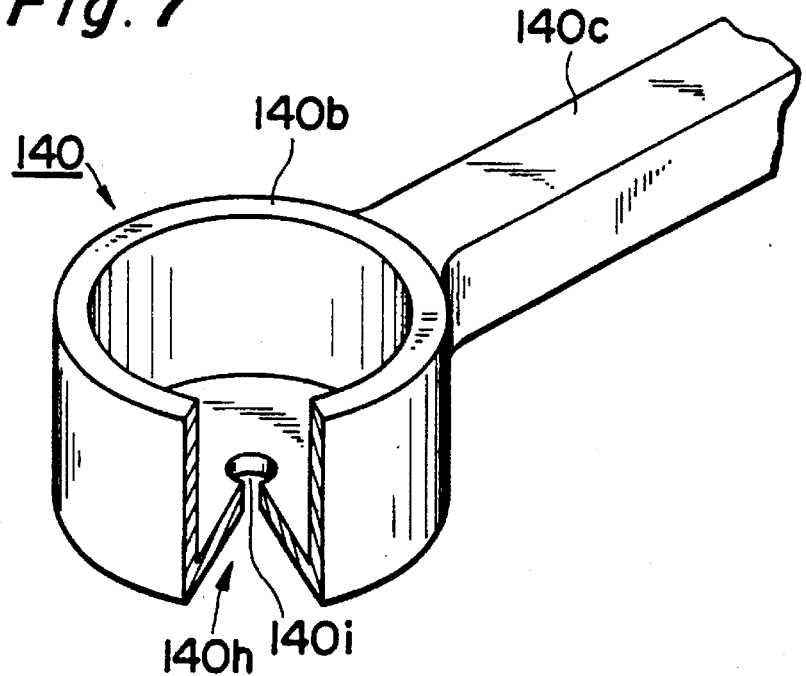
FIG. 7 is a perspective view showing a state in which in electro-optic member is removed from the optical probe head shown in FIG. 6.

An optical probe head 140 shown in FIGS. 6 and 7 comprises a circular cylinder 140b having a bottom and formed integrally with a distal end portion of a support 140c, and a columnar electro-optic conversion element 140a slidably fitted in the cylinder 140b. Note that FIG. 6 is a perspective view of the optical probe head 140, and FIG. 7 is a perspective view of the cylinder 140b and the support 140c in a state wherein the electro-optic conversion member 140a is removed from the optical probe head.

Referring to FIG. 7, a sector-shaped notched portion 140h is formed in the circumferential surface and the bottom end of the cylinder 140b. A small through hole 140i continuous with the notched portion 140h is formed in the central portion of the bottom end of the cylinder 140b.

As shown in FIG. 6, the electro-optic conversion member 140a is fitted in the storage portion of the cylinder 140b, and a small projection 140e (not shown in FIG. 6) formed integrally on the bottom end portion of the electro-optic conversion member 140a is slidably fitted in the small through hole 140i. A reflecting portion 140f (not shown in FIG. 6) having a small area and consisting of an insulating material is fixed on the bottom end of the projection 140e to reflect, inside the electro-optic conversion member 140a, light incident downward on the electro-optic conversion member 140a and propagating through the electro-optic conversion member 140a. That is, the reflecting surface (mirror surface) of the reflecting portion 140f is in tight contact with the bottom end of the small projection 140e, as in FIGS. 2, 3, and 4.

The volume of the electro-optic conversion member 140a is about 1 mm$^3$ and the storage volume of the cylinder 140b is designed in accordance with the volume of the electro-optic conversion member 140a.

At least one projection 148 which is engaged with one end of the notched portion 140h is formed on the outer surface of the electro-optic conversion member 140a. When this projection 148 is engaged with one end of the notched portion 140h, rotation and lateral movement of the electro-optic conversion member 140a are inhibited. Movement of the electro-optic conversion element 140a in the vertical direction Z is not restricted. Therefore, the cylinder 140b has a function serving as a guide means for moving the electro-optic conversion member 140a in only the vertical direction Z.

The base portion of the electro-optical conversion member 140a which is inserted in the storage portion of the cylinder 140b and the small projection 140e extending on the base portion are integrally formed of an electro-optic crystal. Alternatively, the base portion may be formed to have a two-layered structure consisting of light-transmitting glass and an electro-optic crystal, and the small projection 140e consisting of an electro-optic crystal may be formed integrally with the bottom end of the electro-optical crystal of the base portion (FIG. 11).

Although not shown in FIGS. 6 and 7, a contact switch (to be described later) is arranged between the inner contact surfaces of the electro-optic conversion element 140a and the cylinder 140b.

Figure 8:
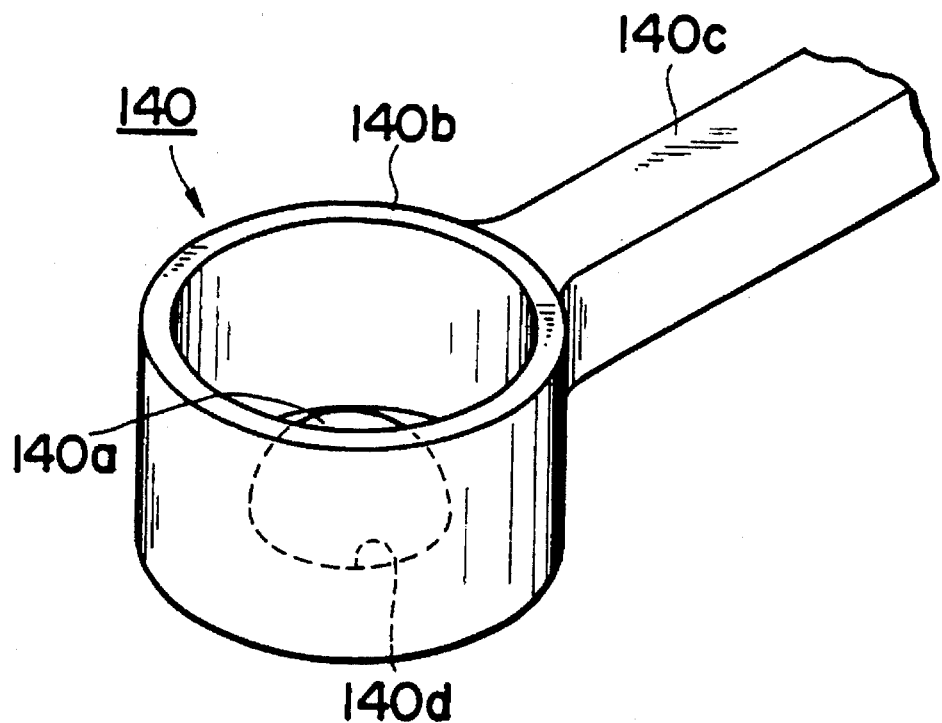
FIG. 8 is a perspective view showing the main part of still another optical probe head.
Figure 9:
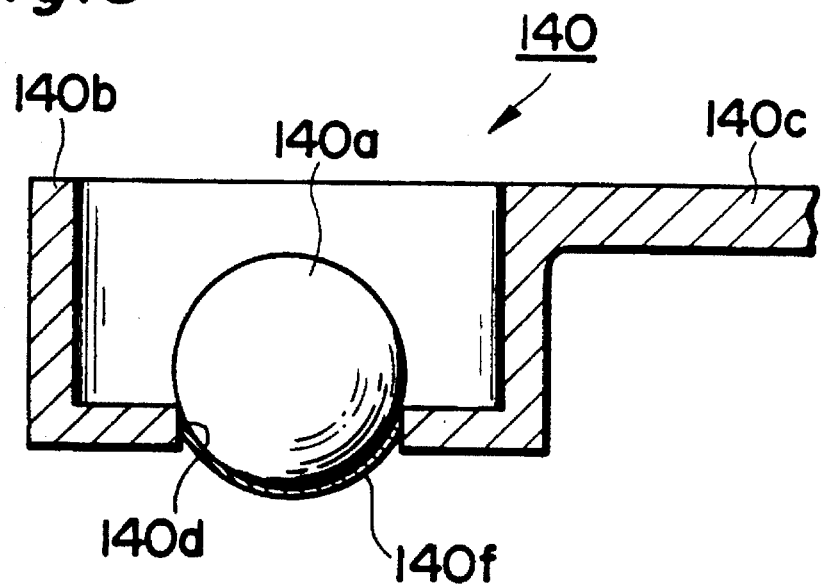
FIG. 9 is a longitudinal sectional view showing the main part of the optical probe head shown in FIG. 8.

An optical probe head 140 shown in FIGS. 8 and 9 comprises a circular cylinder 140b having a bottom and integrally formed with a distal end portion of a support 140c, and a spherical electro-optic conversion member 140a. Note that FIG. 8 is a perspective view of the optical probe head 140, and FIG. 9 is a longitudinal sectional view showing the main part in FIG. 8.

Referring to FIGS. 8 and 9, a circular through hole 140d having a diameter smaller than the diameter of the spherical electro-optic conversion member 140a is formed in the bottom end of the cylinder 140b. The electro-optic conversion member 140a is so fitted as to ride on the circular through hole 140d. If no upward force acts on the electro-optic conversion member 140a, the electro-optic conversion member 140a simply rides on the circular through hole 140d. The bottom end of the electro-optic conversion member 140a extends outside the cylinder 140b through the circular through hole 140d.

A reflecting portion 140f having a small area and consisting of an insulating material is fixed on the bottom end of the projection 140e to reflect, inside the electro-optic conversion member 140a, light incident downward on the electro-optic conversion member 140a and propagating through the electro-optic conversion member 140a.

The volume of the electro-optic conversion member 140a is about 1 mm$^3$, and the storage volume of the cylinder 140b is designed in accordance with the volume of the electro-optic conversion member 140a.

Note that the electro-optic conversion member 140a is constituted by a spherically formed electro-optic crystal.

The electro-optic conversion member 140a can be moved in the vertical direction and is rotatable about the center of the circular through hole 140d. However, lateral movement of the electro-optic conversion member 140a is regulated by abutment with the edge of the circular through hole 140d. In the optical probe head 140 having the structure shown in FIGS. 8 and 9, since the electro-optic conversion member 140a is spherical and symmetrical even if the member 140a is rotated about the through hole 140d, it is not influenced upon rotation. Therefore, the optical probe head 140 has a structure advantageously free from the influence of rotation.

Figure 10:
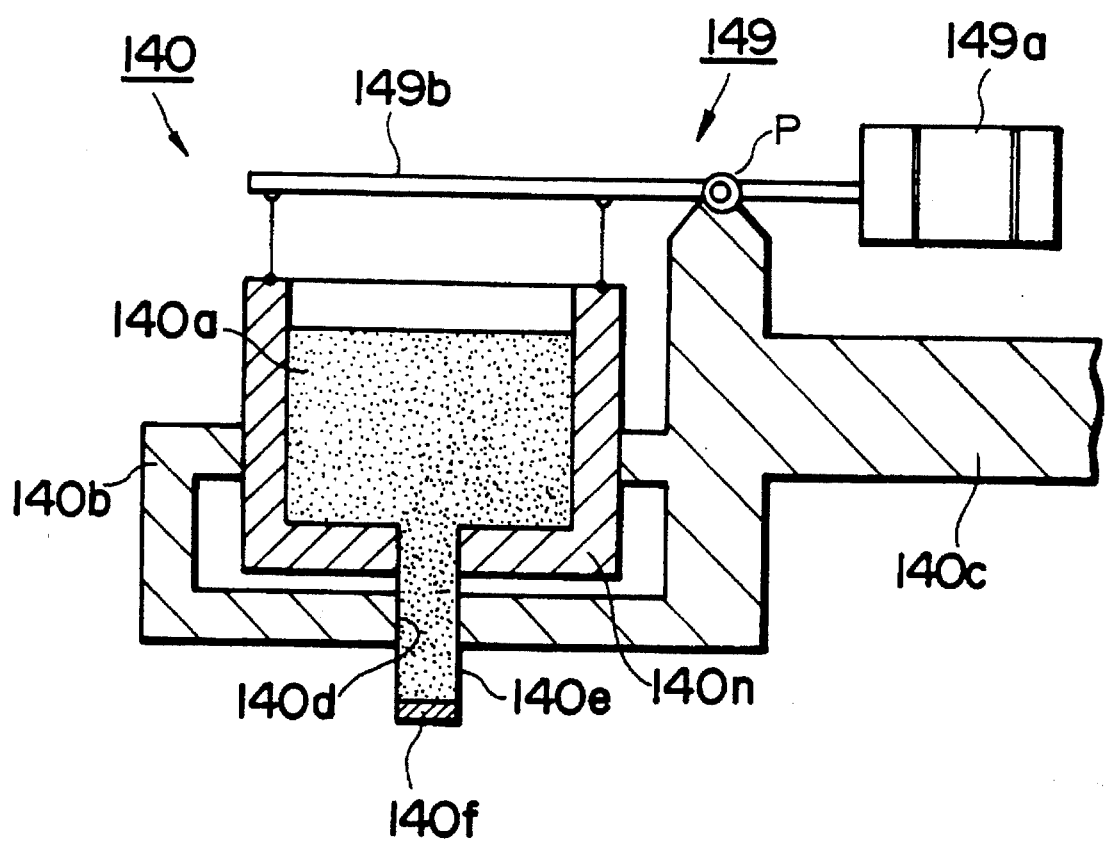
FIG. 10 is a longitudinal sectional view showing the main part of still another optical probe head.

In an optical probe head 140 shown in FIG. 10, an electro-optic conversion member 140a is stored to be vertically movable in a cylinder 140b integrally formed at a distal end portion of a support 140c, and the electro-optic conversion member 140a is suspended from a balance mechanism 149 formed on the support 140c. FIG. 10 is a longitudinal sectional view showing the main part of the optical probe head 140. A rectangular electro-optic conversion member 140a may be stored in a quadrangular cylinder 140b, or a columnar electro-optic conversion member 140a may be stored in a circular cylinder 140b, as in FIGS. 2 to 7.

The optical probe head 140 shown in FIG. 10 is characterized in that a balance rod 149b of the balance mechanism 149 is pivotally supported on one end (fulcrum P) of the cylinder 140b, support member 140n, a counterweight 149a having the same weight as a total weight of the electro-optic conversion member 140a, a small projection 140e, and a reflecting portion 140f is fixed to one end of the balance rod 149b, and the electro-optic conversion member 140a is suspended from the other end of the balance rod 149b through a wire or the like. Note that the small projection 140e is slidably fitted in a through hole formed in the bottom end of the cylinder 140b.

With this structure, even if the optical probe head 140 is moved downward toward a sample 260 (to be described later), and the small projection 140e is brought into -contact with the sample 260, the weight of the electro-optic conversion member 140a hardly acts on the example 260. Therefore, damage to the sample 260 and its breaking can be prevented.

Referring back to FIG. 1, the arrangement of the photodetector 160 will be described below.

The photodetector 160 comprises two PIN photodiodes 160a and 160b and an analyzer 160c (e.g., a polarizing beam splitter). The photodetector 160 differentially detects a phase difference between orthogonally polarized light components of light reflected by the reflecting portion 140f formed on the optical probe head 140 and incident through the objective lens 130, the half mirror 120, and the compensator 150. The Soleil-Babinet compensator 150 applies a bias-like phase difference to the orthogonally polarized light components of the reflected light, so that the phase difference is adjusted to be a ¼ wavelength.

The arrangement of a measuring/control mechanism will be described with reference to FIG. 1. The measuring/control mechanism comprises a device controller 170, a driver 180, a measuring/controlling unit 190, a measuring unit 200, a display 210, and a position controller 220. A display 230 and a keyboard 240 which serve as man-machine interfaces are connected to the device controller 170.

A sample stage 250 is moved in the vertical direction Z in accordance with driving control of a stage controller (not shown) while supporting the sample 260 thereon.

An actuator 270 for probe is the same as a conventional piezoelectric driving unit. A piezoelectric element exhibits a piezoelectric effect by means of a manual operation or a control signal from the position controller 220, and the optical probe head 140 can be moved in the vertical direction Z.

Figure 12:
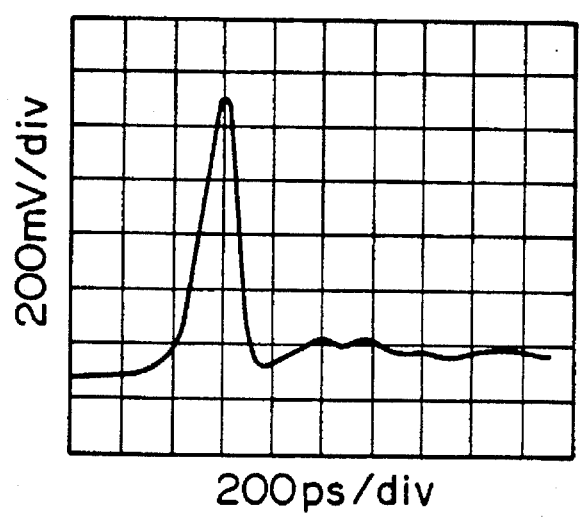
FIG. 12 is a waveform chart of a driving pulse.

The driver 180 supplies an electrical pulse signal, an electrical sinusoidal signal, a logic signal, and the like to the sample device 260. The driver 180 comprises, a COM Generator 33002A available from HP. An impulse measuring signal shown in FIG. 12 is supplied to the sample device 260.

Figure 13:
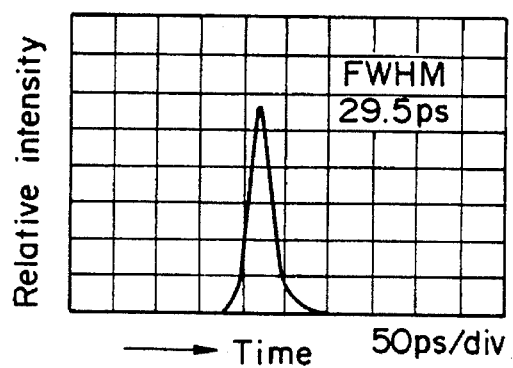
FIG. 13 is a waveform chart of strobe light.

The measuring/controlling unit 190 drives and controls to synchronize the driver 180 with the LD pulse light source 100 and causes the LD pulse light source 100 to generate, e.g., impulse strobe light Ps shown in FIG. 13. The measuring/controlling unit 190 supplies a reference signal to the measuring unit 200 in synchronism with the strobe light Ps. The measuring unit 200 incorporates a lock-in amplifier to synchronously amplify electrical signals from the two photodiodes 160a and 160b and synchronously amplify and output the electrical signal from the measuring/controlling unit 190.

An operation of the electric field measuring apparatus having the above arrangement will be described below.

The overall operational control of the apparatus is performed by the device controller 170.

Figure 14:
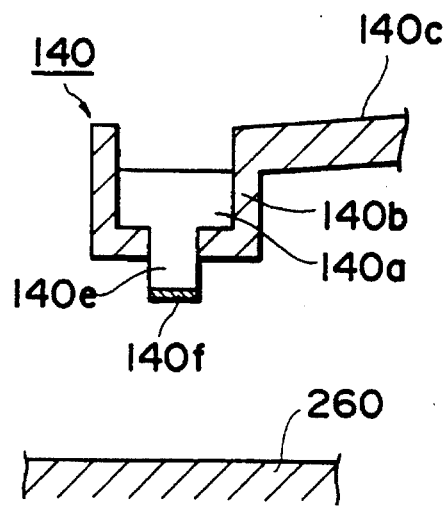
FIG. 14 is a view for explaining a state in which a sample device is in contact with an optical probe head.

The operator operates the keyboard 240 to move the sample stage 250 under the control of the position controller 220, so-that the sample device 260 is located immediately under the optical probe head 140. The actuator 270 for probe is driven under the control of the position controller 220 to adjust the distance between the optical probe head 140 and the sample device 260 (FIG. 14).

Figure 15:
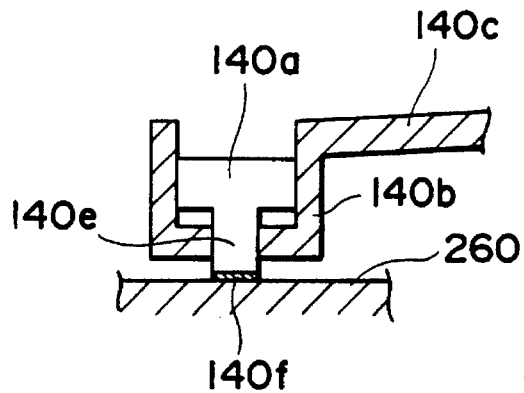
FIG. 15 is a view for explaining another state in which a sample device is in contact with an optical probe head.

When the small projection 140e (the bottom end in the case of the spherical shape in FIGS. 8 and 9) of the electro-optical conversion member 140a in the optical probe head 140 is brought into contact with the sample device 260 and the optical probe head 140 is further moved downward, the electro-optic conversion member 140a is guided within the cylinder 140b and is moved upward, and the bottom surface of the small projection 140e is always kept horizontal (FIG. 15). That is, the reflecting surface of the reflecting portion 140f is always kept perpendicular to the optical axis of the optical mechanism.

The actuator 270 for probe has a considerably large driving force to move the optical probe head 140 and the objective lens 130. When the small projection 140e (bottom surface in the case of spherical shape in FIGS. 8 and 9) of the electro-optic conversion member 140a in the optical probe head 140 is brought into contact with the sample device 260, the electro-optic conversion member 140a is moved upward, and this driving force does not directly act on the sample device 260. Therefore, the sample device 260 is not damaged. That is, the force acting on the sample device 260 is only the sum of the weight of the electro-optic conversion member 140a and the friction (this force is very small because the optical probe head 140 is slowly moved) during sliding movement. These forces are very small, and the sample device 260 will not be damaged.

The range in which the optical probe head 140 can be moved is defined as a stroke starting when the electro-optic conversion member 140a is brought into contact with the sample device 260 and terminating when the cylinder 140b is brought into contact with the sample device 260. The vertical movement of the optical probe head 140 is allowed within this range. High-precision control or the like need not be performed to control the position of the optical probe head 140. A portion for detecting and controlling the distance between the sample device 260 and the optical probe head 140 can be simpler than that of the conventional arrangement. The distance detection portion may be a simple optical displacement sensor, an encoder, or a contact switch.

Figure 16:
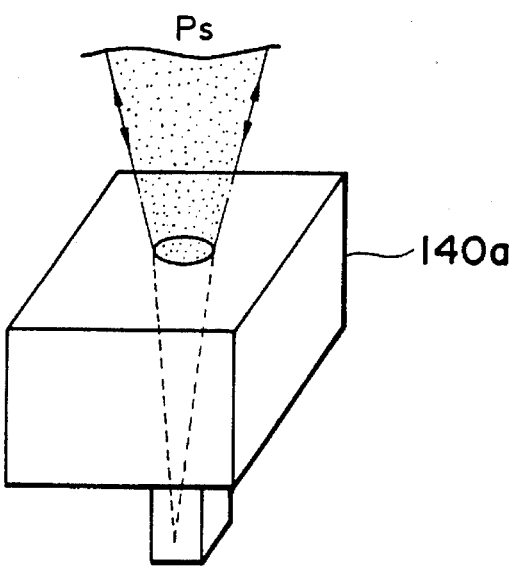
FIG. 16 is a view for explaining an unfocussed state of incident light on an electro-optic member.
Figure 17:
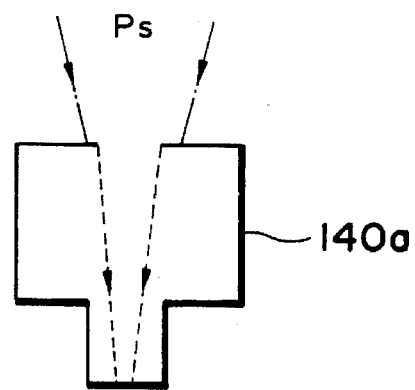
FIG. 17 is a view for explaining another unfocussed state of incident light on an electro-optic member.
Figure 18:
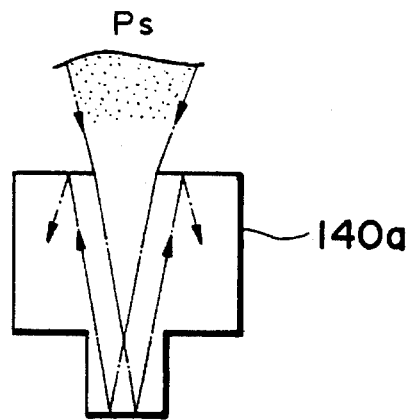
FIG. 18 is a view for explaining reflection in an in-focus state of incident light on an electro-optic member.

A probe structure and a control method for controlling the probe position by using a change in intensity of light reflected by the optical probe head 140 will be described with reference to FIGS. 16 to 18. A light-shielding member 143 having a small opening 145 is formed on the upper surface of the optical probe. The light-shielding member 143 may be a deposition film or a pattern plate. The diameter of the opening 145 is designed such that the diameter of an in-focus image becomes equal to the beam size of the strobe light Ps when the strobe light Ps focused by the objective lens 130 is focused on the reflecting surface of the reflecting portion 140f of the optical probe head 140 (FIG. 16).

When the optical probe head 140 is vertically moved, and the strobe light Ps cannot be focused on the reflecting surface of the reflecting portion 140f, the reflected light incident (FIG. 17) on the opening or emerging (FIG. 18) upon reflection by the reflecting portion 140f is partially shielded. Therefore, the intensity of light received by the photodetector 160 is reduced. The optical probe head 140 is vertically moved to obtain a maximum light reception intensity while this change in intensity of received light is being monitored on the display 230, thereby accurately controlling the positional relationship between the electro-optic conversion member 140a and the objective lens 130.

Arrangements of the contact switch will be described with reference to FIGS. 19 to 21.

Figure 19:
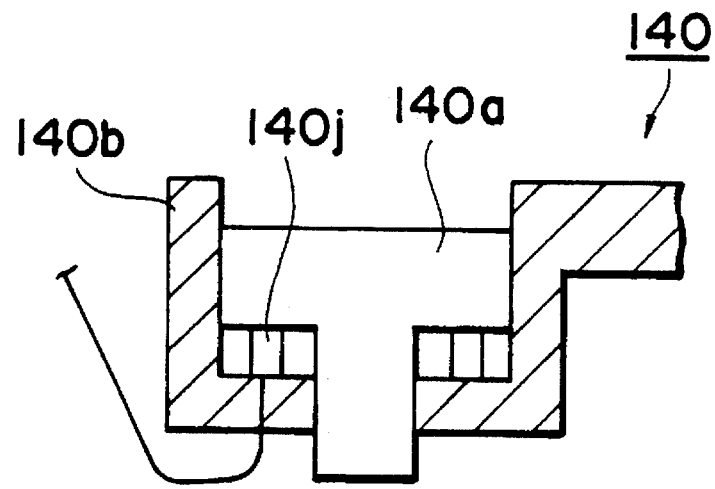
FIG. 19 is a view for explaining an arrangement of a contact switch.

FIG. 19 shows a structure in which mechanical microswitches 140j are interposed between the electro-optic conversion member 140a and the cylinder 140b. When the conversion member 140a is brought into contact with the sample device 260 and the optical probe head 140 is further moved downward, the distance between the electro-optic conversion member 140a and the cylinder 140b is increased to turn off the microswitches 140j. When the microswitches 140j are turned off, the electro-optic conversion member 140a is detected to be in contact with the sample device 260.

Figure 20:
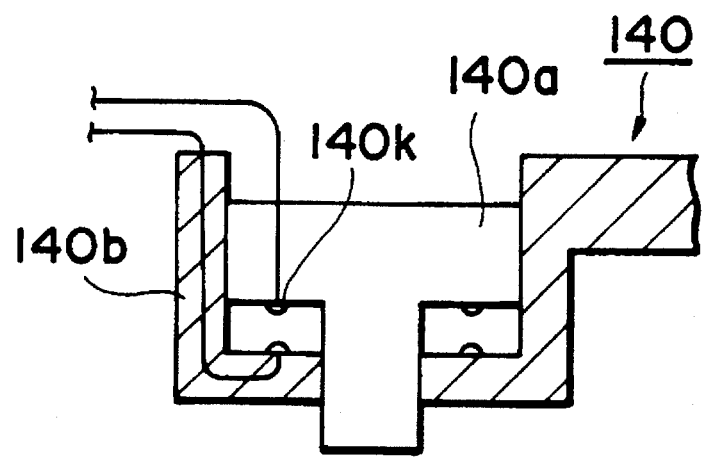
FIG. 20 is a view for explaining an arrangement of another contact switch.

FIG. 20 shows a structure of metal switches 140k each having metal contacts formed on the inner bottom surface of the cylinder 140b and the outer bottom surface of the electro-optic conversion member 140a. When the electro-optic conversion member 140a is brought into contact with the sample device 260 and is moved upward, the metal contacts are separated from each other to obtain an OFF state. By detecting whether the metal contacts are set in ON or OFF state, whether the electro-optic conversion member 140a is in contact with the sample device 260 or not can be detected.

Figure 21:
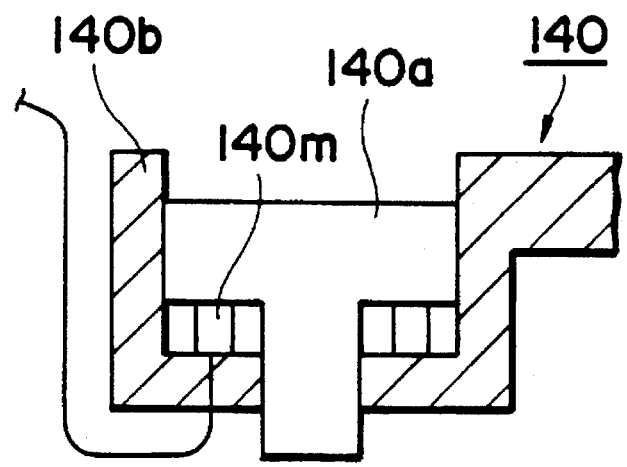
FIG. 21 is a view for explaining an arrangement of still another contact switch.

FIG. 21 shows an arrangement using a piezoelectric element. When the electro-optic conversion member 140a is not in contact with the sample device 260, each piezoelectric element 140m is distorted by the weight of the electro-optic conversion member 140a, and a predetermined voltage output is generated. However, when the electro-optic conversion member 140a is brought into contact with the sample device 260, this voltage output changes. When this voltage change is detected, whether the electro-optic conversion member 140a is in contact with the sample device 260 or not can be detected. In addition, the contact state is detected to adjust the vertical moving speed of the optical probe head 140 by means of the actuator 270 for probe.

In the arrangement shown in FIG. 21, when a voltage is applied to the piezoelectric element 140m, the electro-optic conversion member 140a can be vertically displaced by a very small distance. Vertical movement of the optical probe head 140 can be controlled, and fine adjustment of the distance can be performed with high precision. The position of the objective lens 130 is adjusted such that the strobe light Ps is focused on the reflecting surface of the reflecting portion 140f of the electro-optic conversion member 140a while monitoring the focal state on the display 230.

When the electro-optic conversion member 140a is brought into contact with the sample device 260 as described above, an electric field generated by the sample device 260 is measured.

A driving pulse is supplied from the measuring/controlling unit 190 to the LD pulse light source 100 to output the strobe light Ps. The strobe light Ps emitted from the LD pulse light source 100 is incident on the electro-optic conversion member 140a through the polarizer 110, the half mirror 120, and the objective lens 130 and is reflected by the reflecting surface of the reflecting portion 140f formed on the bottom end of the electro-optic conversion member 140a. The reflected light is incident on the photodetector 140 through the objective lens 130, the half mirror 120, and the Soleil-Babinet compensator 150 in the order named.

The refractive index of the electro-optic crystal of the electro-optic conversion member 140a changes in accordance with a change in electric field generated by a voltage of electric wiring of the sample device 260, and the polarization state of the strobe light Ps changes accordingly. The polarized reflected light passes through the Soleil-Babinet compensator 150 and is incident on the photodetector 160. A change in polarization state of the electro-optic crystal is detected as a change in light intensity (optical modulation).

At the same time, the change in polarization state is converted into an electrical signal. The measuring unit 200 synchronously amplifies this electrical signal to measure the electric-field strength of the sample device 260. To measure the voltage distribution or the like of the wiring of the sample device 260, strobe light Ps is incident at slightly different timings with respect to the electrical signals Dn the sample device 260.

When a measurement is performed while the distal end portion of the small projection 140e of the electro-optic conversion member 140a is in contact with the sample device 260, the distance between the electro-optic crystal and the sample device 260 is almost zero. The electro-optic crystal is easily susceptible to the influence of the electric field of the sample device 260. As a result, the refractive index of the electro-optic crystal greatly changes even in a very weak electric-field strength, thereby increasing the measurement sensitivity.

In this embodiment, the laser diodes are used to constitute the light source 100 and are electrically turned on. The ON timings are electrically controlled, and an optical system for optical delay need not be used, thereby simplifying an optical mechanism. The time resolution for an electrical signal waveform measured by this apparatus almost corresponds to the pulse width of the strobe light Ps.

Figure 22:
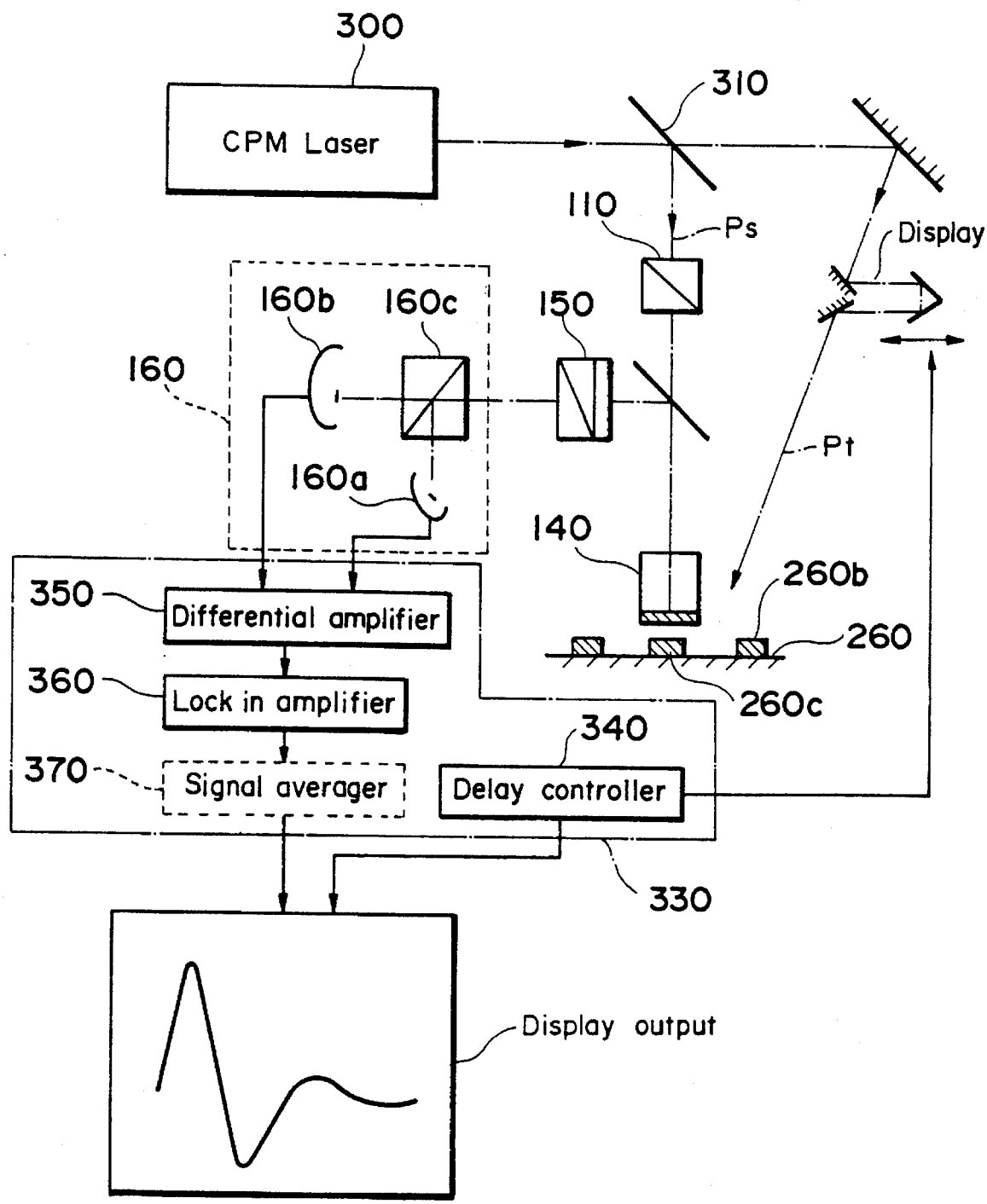
FIG. 22 is a block diagram showing an arrangement according to the second embodiment of the present invention.

The second embodiment will now be described with reference to FIG. 22. In the above embodiment (first embodiment), an external electrical signal is applied to the sample device 260 to perform measurement. However, if any means for generating an electrical signal to a sample device 260 is arranged, strobe light Ps can be split and the split light beam can be used as a trigger pulse, thereby generating an electrical signal by means of light. The second embodiment is based on this principle. For descriptive convenience, the same reference numerals as in the first embodiment denote the same parts in the second embodiment, and a detailed description thereof will be omitted.

An apparatus of the second embodiment utilizes a principle in that an electrode 260b applied with-a predetermined voltage (including a ground potential) and an electrode 260c of the sample as the sample device 260 are short-circuited by a photoelectric effect of a semiconductor.

In this apparatus, an electrical signal to be measured is generated in synchronism with a light pulse. Unlike in the previous method using LDs for synchronizing the light pulse with the electrical signal, a laser having a short pulse can be used. A CW mode synchronous laser 300 (e.g., a CPM ring dye laser, a CPM-LD, a Kerr lens mode synchronous Ti: sapphire laser, or an LD-pumped Kerr lens mode synchronous Cr: LiSAF laser) is used. The CPM laser 300 emits very short pulse light (e.g., repeating rate: 100 Mhz; pulse width: 70 fs). A half mirror 310 is used to split the very short pulse light into strobe light Ps and trigger light Pt. An optical delay 320 adjusts the delay time of the trigger light Pt by means of an optical path difference. A delay controller 340 added in a measuring unit 330 adjusts the delay path difference of the optical delay 320. The above arrangement is the characteristic feature of the apparatus of this embodiment. A differential amplifier 350 and a lock-in amplifier 360 are arranged in the measuring unit 330 as in the first embodiment. A signal averager 370 is arranged to increase the S/N ratio, as needed.

The operation of this apparatus is the same as that of the apparatus of the first embodiment, except that the electrode 260b and the electrode 260c of the sample are short-circuited to cause the trigger light Pt to serve as a driving pulse. In the apparatus of the second embodiment, the same effect as in the first embodiment can be obtained by using the optical probe head 140 as in the first embodiment.

The third embodiment will be described with reference to FIG. 23. In the third embodiment, the photodetector 160 of the first embodiment is constituted Dy a high-speed photodetector such as a high-speed PIN photodiode or a streak camera. That is, a CW laser source {00 (e.g., an He—Ne laser, a laser diode, an Nd: YAG laser, or an LiSAF laser) is used in place of the LD pulse light source 100, and a streak camera 420 is used in a photodetector 410. A measuring unit 430 need not perform lock-in amplification, and a waveform from the streak camera 420 is directly displayed on a display 440, thus simplifying the arrangement. Other arrangements are substantially the same as those of the previous embodiments. Even this apparatus can obtain the same effect as described above if the optical probe head 140 is used.

The present invention is not to be construed as limited to the particular embodiments described above. Various changes and modifications may be made. For example, as shown in the sectional views of FIGS. 24(a) to 24(d), the electro-optic conversion member 140a of the optical probe head 140 may be entirely formed of an electro-optic crystal K (hatched portion), or may be constituted by a combination of a glass block G and an electro-optic crystal K (hatched portion).

As shown in FIGS. 25(a) to 25(d), the sectional shape of the electro-optic conversion member 140a may be any one of various shapes in accordance with design specifications.

Figure 26:
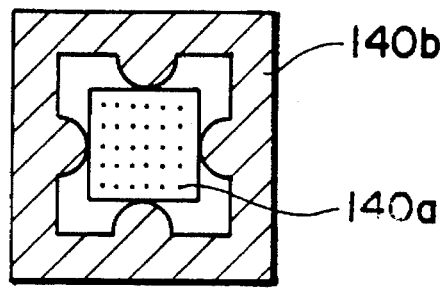
FIG. 26 is a view for explaining the sectional shape of a modification of the optical probe head.
Figure 27:
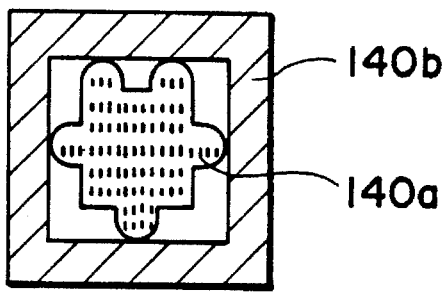
FIG. 27 is a view for explaining the sectional shape of another modification of the optical probe head.
Figure 28:
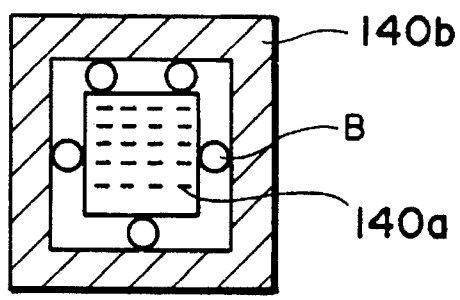
FIG. 28 is a view for explaining the sectional shape of still another modification of the optical probe head.

The friction between the cylinder 140b and the electro-optic conversion member 140a is preferably small. It is effective to implement a means for reducing the friction in accordance with the following method. For example, a means for applying a lubricant to contact surfaces of the cylinder 140b and the electro-optic conversion member 140a or a means for performing a surface treatment such as Teflon coating may be provided. As shown in FIGS. 26 and 27, projections 141 may be formed on one of the cylinder 140b and the electro-optic conversion element 140a to reduce the contact area. As shown in FIG. 28, ball bearings B may be effectively interposed between the cylinder 140b and the electro-optic conversion member 140a.

Figure 29:
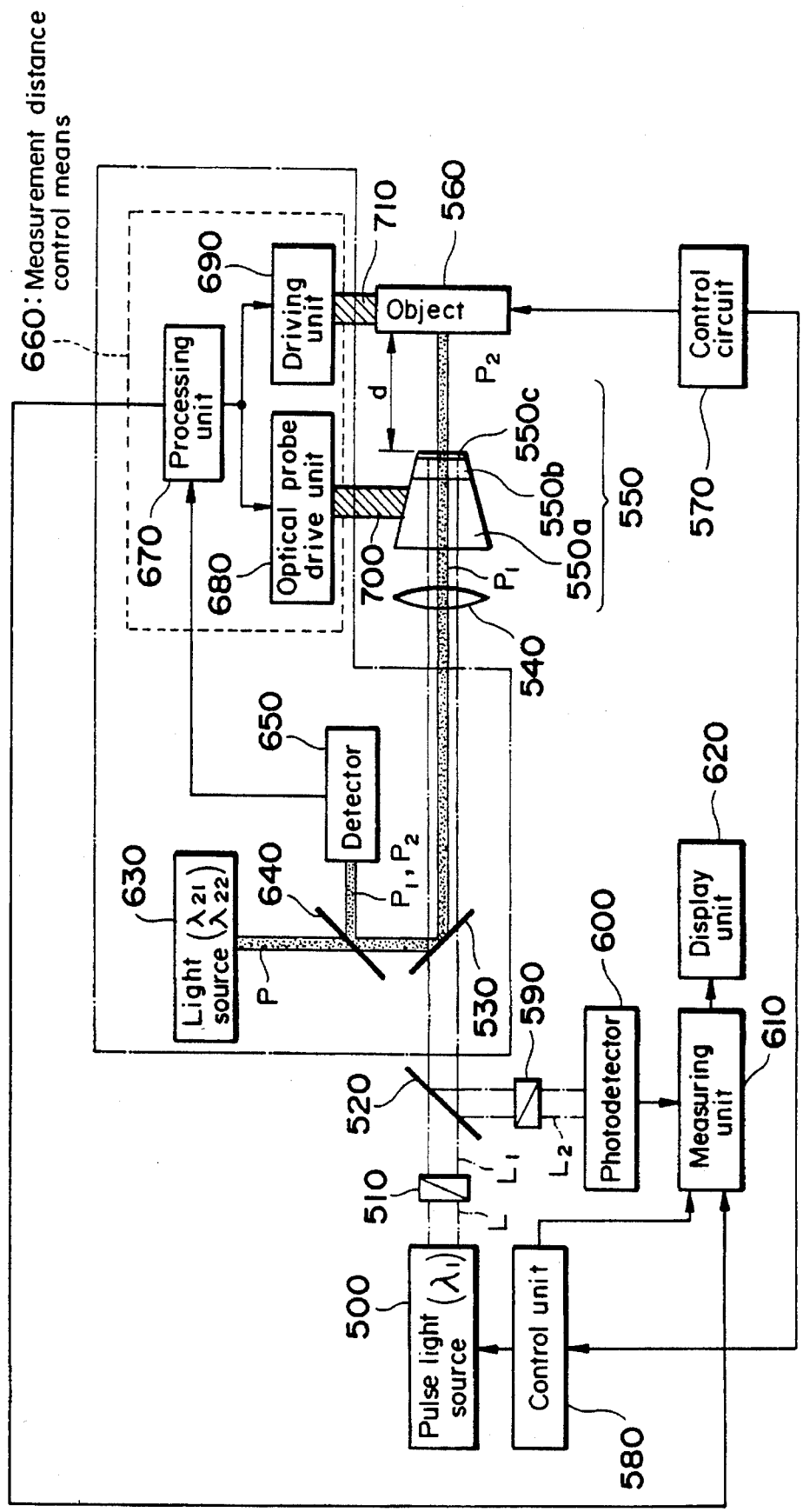
FIG. 29 is a block diagram of an arrangement of an apparatus for precisely controlling the distance between sample and an electro-optic member.
Figure 30:
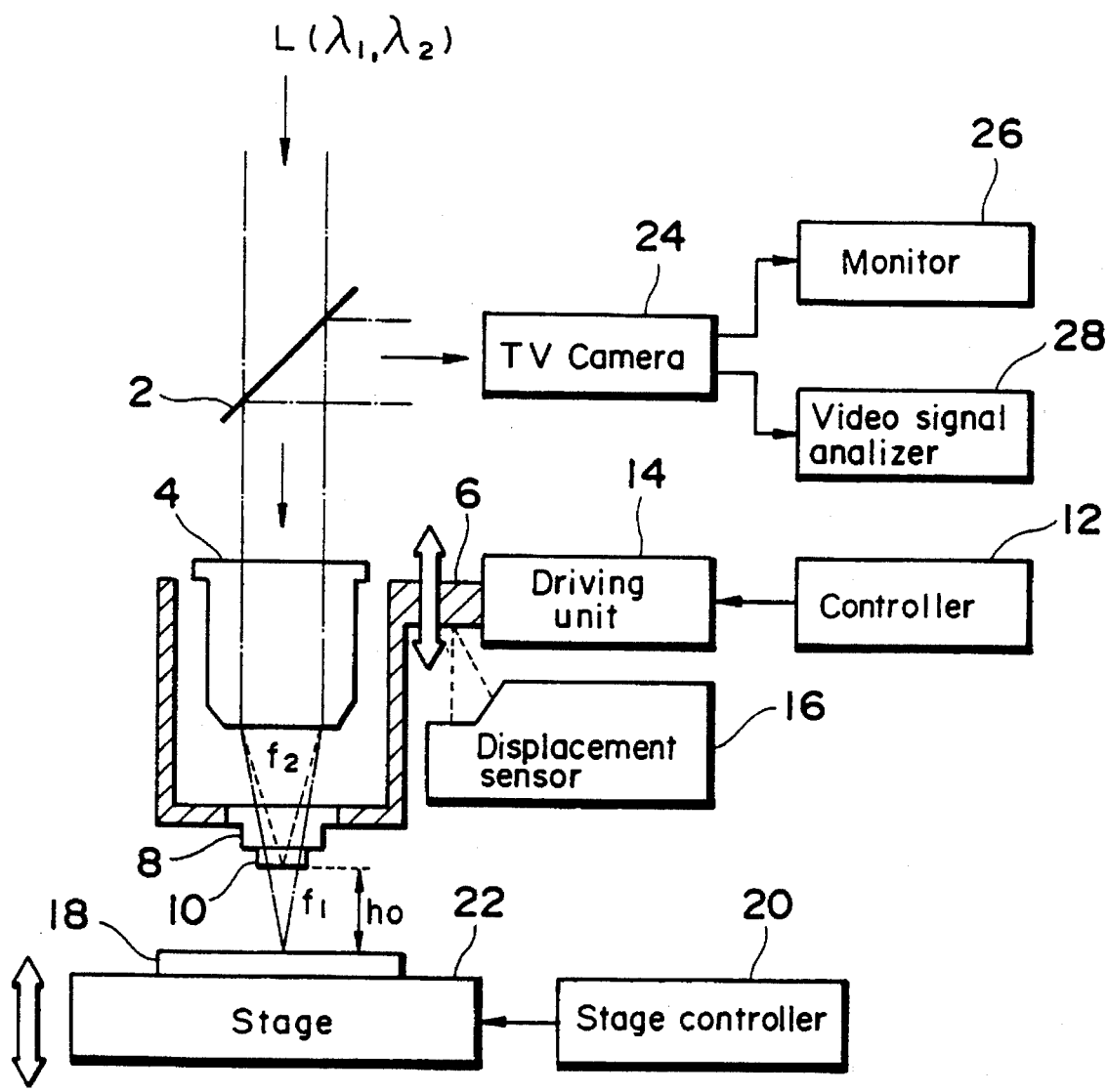
FIG. 30 is a block diagram showing an arrangement of 1 conventional electric field measuring apparatus.

To precisely control the distance between the sample and the electro-optic conversion member of the optical probe head, this distance between the sample and the probe may be detected as in the conventional case, and the distance may be controlled in accordance with the detection result. Except for the conventional case, for example, as disclosed in Japanese Patent Laid-open Application No. 3-226267, which matured into Japanese Patent No. 5-107273 and was filed by the present applicant, coherent light for position detection may be used in addition to the strobe light Ps to precisely measure the distance between the sample and the probe (FIG. 29).

The electro-optic crystal is not limited to LiNbO3, but may be LiTaO$_3$, GaAs, BSO, ZnTe, or KDP may be used. An electro-optic material such as an organic molecular film Dr molecular thin film may be used in place of the electro-optic crystal.

In each embodiment described above, the optical probe head 140 has a structure in which the electro-optic conversion member 140a is inserted in the cylinder 140b. The present invention is not limited to this cylinder 140b. That is, the cylinder 140b originally has a function of supporting and guiding the electro-optic conversion member 140a to be reciprocally movable in the vertical direction Z. The cylinder 140b need not have a cylindrical shape. A means having a guide mechanism for supporting and guiding the electro-optic conversion member 140a to be reciprocally movable in the vertical direction Z is incorporated in the present invention.

The structure and the function of the electric field measuring apparatus of FIG. 29 will be explained below. That is, pulse light L of a $\lambda_1$ wavelength is emitted from the pulse light source 500. A polarizer 510 transmits a certain polarized component of the emitted pulse light $L_1$. The polarized pulse light is represented by L~. The transmitted pulse light L1 passes a half mirror 530 and a dichroic mirror. The dichroic mirror 530 is transparent with respect to the light of a $\lambda_1$–wavelength. The pulse light L1 which has passed the dichroic mirror 530 is caused by an objective lens 540 to pass a glass support 550a and an electro-optic material 550b supported on the Blass support 550a to be converged onto a multi-layer film mirror 550c.

An optical probe 550 includes the glass support 550a, the electro-optic material 550b and the multi-layer film mirror 550c. The optical probe 550 is positioned at a measuring distance d from an object to be measured, such is an integrated circuit. The object to be measured is operative with a source power and signals from an object-to-be-measured control circuit 570. The object-to-measured control circuit 570 supplies control signals to a control unit 580, and the control unit 580, in response to the control signals, controls lighting timing of the pulse light source 500. Concurrently therewith the control unit 580 supplies control signals to a measuring unit 610.

The pulse light $L_1$ converged on the multi-layer film mirror 550c is reflected on the same and again passes the electro-optic material 550b. A refractive index of the electro-optic material 550b transmitting the pulse light $L_1$ varies depending on a voltage change generated on the surface of the object to be measured 560. A polarized component of the pulse light L which has entered the optical probe 550 is changed in accordance with the voltage change of the object to be measured 560 and is emitted in a direction opposite to that of the entrance. The pulse light $L_1$ emitted from the optical probe 550 in the opposite direction is reflected on the half mirror 520 to enter an optical probe head 590. The pulse light $L_1$ passes the optical probe head 590 to have only a certain polarized component of the pulse light $L_1$ taken out to be supplied to a photodetector 600. The pulse light component to be supplied to the photodetector 600 is represented by $L_2$. The photodetector 600 outputs to the measuring unit 610 a detection signal corresponding to an intensity of the supplied pulse light $L_2$. The measuring unit 610, based on the control signal from the control unit 580, amplifies and detects the detection signal to detect a voltage of the object to be measured 560. A display unit 620 receives and displays data of the detected voltage. The light source for emitting light of a –wavelength is not limited to the pulse light source but may be a continuous light source.

The principle of measuring and controlling a measured distance d between the optical probe 550 and the object to be measured 560 will be explained. A second light source 630 emits light P of a $\lambda_{22}$-wavelength different from the light pulse of a $\lambda_{21}$-wavelength from the first pulse light source. This light P passes the half mirror 58 and is reflected on the dichroic mirror 530. The dichroic mirror 530 normally reflects the light P. The reflected light P is converged on the multi-layer film mirror 550c by the objective lens 540. The multilayer film mirror 550c reflects a part of the light L of $\lambda_{22}$-wavelength and passes the remaining part thereof. The light (a first reflected light) reflected on the multi-layer film mirror 550c is called reflected light $P_1$, and the light (a second mirror) which has passed the multi-layer film mirror 550c, has been reflected on the surface of the object to be measured 560 and has again passed the multi-layer film mirror 550c is called reflected light $P_2$. The reflected light $P_1$, $P_2$ are reflected on the dichroic mirror and the half mirror 640, and are supplied to an interference light detector 650 which is a second photodetecting means. The interference light detector 650 detects in interference output I an intensity of interference light generated by the two reflected light. The interference output I has a constant relationship with the measurement distance d and is proportional to $\sin^2(2d/\lambda_2)$. A processing unit 670 receives an interference output I from the interference light detector 650 and compute a measurement distance d, based on the above-mentioned relationship.

The optical probe 550 and the object to be measured 560 are supported by the supports 700, 710. These two supports 700, 710 are driven by an optical probe driving unit 680 and an object-to-be-measured driving unit 690. These drive units 680, 690 include motors, piezoelectric elements, etc. The processing unit 670 outputs, based on the computed distance d, respective control signals to the optical probe drive unit 680 and to the object-to-measured drive unit 690 so as to drive the optical probe 550 and the object to be measured 560 to control the measured distance d. That is, the processing unit 670, the optical probe drive unit 680 and the object-to-be-measured drive unit 690 constitute measurement distance control means 660.

Thus, this embodiment can directly measure a measurement distance between the optical probe 550 and the object to be measured 560. Accordingly as in the conventional apparatuses, it is not necessary to preset a reference distance. An advantage of this embodiment is that the operation of controlling a measurement distance is simple. The control of a measurement distance uses interference of light, and because the control is based on wavelengths, the accuracy of the control can be accordingly high. As a result, a short measuring distance can be used than in the conventional apparatuses, and accordingly higher detection sensitivity can be obtained. In addition, control can be made to reproduce a measurement distance.

Information of a measurement distance d computed by the processing unit 670 is supplied to the measuring unit 610. Based on the information, the measuring unit 610 conducts correction of detection signals from the photodetector 600 and corrects measured voltages. A measured voltage of the object to be measured 560 is corrected based on an accurate measurement distance. Accordingly accurate voltages can be obtained.

It is not necessary to provide outside a photodisplacement sensor, as in the conventional apparatuses, because the distance measurement is conducted in a field width of the objective lens 540. In addition, no expensive multi-focus lens is necessary, as in the conventional apparatuses, and the apparatus can be accordingly inexpensive.

In the above-described embodiment, the light from the light source 630 is not converged on the surface of the object to be measured 560 but is converged on the multi-layer film mirror 550c. Accordingly a beam is applied to the surface of the object to be measured 560 in a constant area. That is, a measurement distance to be measured is an average distance between the optical probe 550 and the above-mentioned constant area on the surface of the object to be measured 560. In some cases different from this case, a measurement distance has to be measured in a very small area on the surface of the object to be measured 560. In these cases, light can be converged on the surface of the object to be measured 560 to compute a measurement distance in the very small converged area.

Reversely in the case that an average measurement distance has to be measured in a large area, the light from the light source 630 is not converted to illuminate a certain area.

As has been described above, according to the present invention, even if an electro-optic material is brought into contact with a sample, the electro-optic material is guided by a guide mechanism, and an excessive force does not act on the sample. Therefore, damage to the sample and its breaking can be prevented in advance. The electric-field strength of the sample is measured in this contact state to increase the measurement sensitivity. In addition, the optical probe head has a very simple structure to facilitate maintenance, adjustment, and the like.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An electro-optic probe apparatus for measuring an electric field of a sample, comprising:
   a freely reciprocating electro-optic member comprised of an electro-optic material;
   a guide mechanism for supporting said freely reciprocating electro-optic member to be freely reciprocally movable within a predetermined stroke range, said free reciprocal movement occuring only in directions normal to said sample; and
   driving means for reciprocating said guide mechanism in said direction of said sample.

2. An apparatus according to claim 1, wherein:
   said guide mechanism comprises a cylinder which slidably receives and supports said freely reciprocating electro-optic member.

3. An apparatus according to claim 2, wherein:
   said guide mechanism further comprises first means for reducing friction when sliding said freely reciprocating electro-optic member relative to said cylinder, and for supporting said freely reciprocating electro-optic member, said first means for reducing friction when sliding being between said freely reciprocating electro-optic member and said cylinder.

4. An apparatus according to claim 3, wherein:
   said first means for sliding comprises a bearing interposed between an inner wall of said cylinder and said freely reciprocating electro-optic member.

5. An apparatus according to claim 3, wherein:
   said cylinder comprises a projection provided on an inner wall of said cylinder.

6. An apparatus according to claim 1, wherein:
   said guide mechanism comprises distance measuring means for measuring a distance between said sample and said guide mechanism.

7. An apparatus according to claim 1, wherein:
   said freely reciprocating electro-optic member comprises a light-transmitting base portion opposing said sample, said electro-optic material being fixed to an end portion of said light-transmitting base portion.

8. An apparatus according to claim 1, wherein:
   an end portion of said freely reciprocating electro-optic member which opposes said sample comprises a small projection having a smooth distal end.

9. An apparatus according to claim 1, wherein said guide mechanism has a holder comprising:
   a bottom wall having a hole; and
   a side wall being continuous to said bottom wall, surrounding said freely reciprocating electro-optic member, and having an aperture including a first face and a second face facing each other, said freely reciprocating electro-optic member having a projection located between said first face and said second face of said holder; and
   said freely reciprocating electro-optic member being movable along said side wall of said holder and stopping when said projection of said freely reciprocating electro-optic member comes into contact with one of said first face and said second face of said holder.

10. An apparatus according to claim 1, wherein said guide mechanism has a holder comprising:
    a bottom wall having a hole; and
    a side wall being continuous to said bottom wall, surrounding said freely reciprocating electro-optic member, and having an aperture including a first face and a second face facing each other, said aperture being connected to said hole by means of a slot penetrating through said bottom wall;
    said freely reciprocating electro-optic member having a projection located between said first face and said second face of said holder; and
    said freely reciprocating electro-optic member being movable along said side wall of said holder while said projection is in contact with one of said first and second faces.

11. An electro-optic probe apparatus for measuring an electric field of a sample, comprising:
    a freely reciprocating first member having an electro-optic member; and
    a cylinder having an inner surface being in contact with said freely reciprocating first member, said cylinder supporting said freely reciprocating first member so as to be freely reciprocally movable within a predetermined stroke range over said inner surface of said cylinder.

12. An apparatus according to claim 11, wherein:
    said inner surface of said cylinder has a projection.

13. An apparatus according to claim 11, wherein:
    said inner surface of said cylinder has a projection, said projection being in contact with said freely reciprocating first member while said freely reciprocating first member moves relative to said cylinder.

14. An apparatus according to claim 11, wherein:
    said freely reciprocating first member fits into said cylinder.

15. An apparatus according to claim 11, wherein:
    said cylinder is non-circular;
    said freely reciprocating first member fits into said cylinder; and
    said freely reciprocating first member is not rotatable relative to said cylinder.

16. An apparatus according to claim 11, wherein:
    said inner surface of said cylinder has a square corner;
    said freely reciprocating first member fits into said cylinder; and
    said freely reciprocating first member is not rotatable relative to said cylinder.

17. An apparatus according to claim 11, further comprising:

a light-shielding film having an aperture, said light-shielding film being fixed to said freely reciprocating first member.

18. An apparatus according to claim 11, further comprising:
   a light source for emitting light;
   a photodetector for detecting light emitted by said light source; and
   a light-shielding film having an aperture, said light-shielding film being fixed to said freely reciprocating first member, said light from said light source traveling through said aperture in a first direction, said light being reflected by said freely reciprocating first member and traveling back through said aperture in a second direction opposite to said first direction, and being detected by said photodetector.

19. An apparatus according to claim 11, further comprising:
   a light source for applying first light to said freely reciprocating first member;
   an objective lens located in a light passage of said first light traveling between said light source and said freely reciprocating first member;
   a photodetector for detecting said first light from said freely reciprocating first member; and
   a light shielding film fixed to said freely reciprocating first member, having an aperture, said light from said light source traveling through said aperture in a first direction, said light being reflected by said freely reciprocating first member, and traveling back through said aperture in a second direction opposite said first direction, and being detected by said photodetector.

20. An apparatus according to claim 11, further comprising:
   a light source for applying first light to said freely reciprocating first member;
   an objective lens located in a light passage of said first light traveling between said light source and said freely reciprocating first member;
   a photodetector for detecting an intensity of said first light from said freely reciprocating first member; and
   a light-shielding film fixed to said freely reciprocating first member, having an aperture, said light from said light source traveling through said aperture in a first direction, said light being reflected by a reflecting portion of said freely reciprocating first member and traveling back through said aperture in a second direction opposite said first direction, and being detected by said photodetector;
   whereby said freely reciprocating first member is moved relative to said objective lens so as to increase said intensity of said first light, said first light being focused on said reflected portion of said freely reciprocating first member.

21. An apparatus according to claim 11, further comprising:
   a light source for applying first light to said freely reciprocating first member;
   an objective lens located in a light passage of said first light traveling between said light source and said freely reciprocating first member;
   a lens holder for holding said objective lens;
   a half mirror located in said light passage;
   a polarizer located between said half mirror and said light source;
   a photodetector for detecting an intensity of said first light from said freely reciprocating first member, said photodetector outputting an electrical signal;
   a controlling unit for applying a driving pulse to said light source;
   a measuring unit for amplifying said electrical signal to measure an electric-field of said sample; and
   an actuator for moving said cylinder relative to said sample.

22. An apparatus according to claim 11, wherein:
   said freely reciprocating first member has a spherical surface.

23. An electro-optic probe apparatus for measuring an electric field of a sample, comprising:
   a freely reciprocating first member including an electro-optic member, said freely reciprocating first member including a projection; and
   a holder having an inner surface in contact with said projection of said freely reciprocating first member, said holder supporting said freely reciprocating first member to be freely reciprocally movable within a predetermined stroke range over said inner surface of said holder.

24. An electro-optic apparatus according to claim 23, wherein:
   said holder is cylindrically shaped, and said freely reciprocating first member fits into said holder.

25. An apparatus according to claim 23, wherein:
   said holder has a guiding groove, said guiding groove being along a first direction, said projection of said freely reciprocating first member being located in said guiding groove and being in contact with said holder;
   whereby said freely reciprocating first member moves only in said first direction when said freely reciprocating first member comes into contact with said sample.

26. An apparatus according to claim 23, further comprising:
   a light source for applying first light to said freely reciprocating first member;
   an objective lens located in a light passage of said first light traveling between said light source and said freely reciprocating first member;
   a lens holder for holding said objective lens;
   a half mirror located in said light passage;
   a polarizer located between said half mirror and said light source;
   a photodetector for detecting an intensity of said first light from said freely reciprocating first member, said photodetector outputting an electrical signal;
   a controlling unit for applying a driving pulse to said light source;
   a measuring unit for amplifying said electrical signal to measure an electric-field of said sample; and
   an actuator for moving said cylinder relative to said sample.

27. An electro-optic probe apparatus for measuring an electric field of a sample, comprising:
   a holder; and
   a freely reciprocating electro-optic member located in said holder, said holder supporting said freely reciprocating electro-optic member so as to be freely reciprocally movable within a predetermined stroke range within said holder, said freely reciprocating electro-optic member having a spherical surface.

28. An apparatus according to claim 27, wherein:
said holder has an aperture having a first diameter; and
said freely reciprocating electro-optic member has a second diameter larger than said first diameter.

29. An apparatus according to claim 27, further comprising:
a light source applying first light to said freely reciprocating electro-optic member;
an objective lens located in a light passage of said first light traveling between said light source and said freely reciprocating electro-optic member;
a lens holder holding said objective lens;
a half mirror located in said light passage;
a polarizer located between said half mirror and said light source;
a photodetector detecting an intensity of said first light from said freely reciprocating electro-optic member, said photodetector outputting an electrical signal;
a controlling unit applying a driving pulse to said light source;
a measuring unit for amplifying said electrical signal to measure an electric-field of said sample; and
an actuator moving said cylinder relative to said sample.

* * * * *